(12) United States Patent
Yamanaka et al.

(10) Patent No.: US 10,108,562 B2
(45) Date of Patent: Oct. 23, 2018

(54) SEMICONDUCTOR DEVICE INCLUDING A REQUEST ISSUING CONTROLLER

(71) Applicant: Renesas Electronics Corporation, Tokyo (JP)

(72) Inventors: Sho Yamanaka, Kodaira (JP); Toshiyuki Hiraki, Kodaira (JP); Yoshihiko Hotta, Tokyo (JP); Takahiro Irita, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 93 days.

(21) Appl. No.: 15/127,765

(22) PCT Filed: Oct. 1, 2015

(86) PCT No.: PCT/JP2015/005013
§ 371 (c)(1),
(2) Date: Sep. 20, 2016

(87) PCT Pub. No.: WO2017/056132
PCT Pub. Date: Apr. 6, 2017

(65) Prior Publication Data
US 2017/0270063 A1 Sep. 21, 2017

(51) Int. Cl.
*G06F 13/16* (2006.01)
*G06F 13/40* (2006.01)

(52) U.S. Cl.
CPC ...... *G06F 13/1673* (2013.01); *G06F 13/1605* (2013.01); *G06F 13/4068* (2013.01)

(58) Field of Classification Search
CPC ............. G06F 13/1605; G06F 13/1673; G06F 13/4068; G11C 11/406
See application file for complete search history.

(56) References Cited

U.S. PATENT DOCUMENTS 6,006,303 A * 12/1999 Barnaby .................. G06F 13/18
710/240
2004/0093442 A1* 5/2004 Furuya ................... G06F 3/0613
710/52
(Continued)

FOREIGN PATENT DOCUMENTS

JP 2004-171541 A 6/2004
JP 2005-258867 A 9/2005
(Continued)

OTHER PUBLICATIONS

The translated internatial search report for PCT/JP2015/005013, dated Dec. 13, 2016; retreived online from EP register.*
(Continued)

*Primary Examiner* — Eric T Oberly
(74) *Attorney, Agent, or Firm* — McGinn IP Law Group, PLLC

(57) ABSTRACT

A semiconductor device according to the present invention includes a plurality of masters (100), a memory controller (400a), a bus that connects the plurality of masters (100) and the memory controller (400a), a QoS information register (610) that stores QoS information of the plurality of masters (100), a right grant number controller (602) that calculates the number of grantable access rights based on space information of a buffer (401) of the memory controller (400a), a right grant selection controller (603a) that selects the master (100) which will be granted the access right based on the QoS information of the QoS information register (610) and the number of grantable rights from the right grant number controller (602), and a request issuing controller (201a) that does not pass a request of the master (100) which has not been granted the access right from the right grant selection controller (603a).

24 Claims, 17 Drawing Sheets

(56) References Cited

U.S. PATENT DOCUMENTS

| | | |
|---|---|---|
| 2005/0204085 A1 | 9/2005 | Fukuyama et al. |
| 2013/0219004 A1 | 8/2013 | Mace et al. |
| 2014/0223053 A1* | 8/2014 | Yoshida .............. G06F 13/1689 |
| | | 710/110 |

FOREIGN PATENT DOCUMENTS

| | | |
|---|---|---|
| JP | 2011-095966 A | 5/2011 |
| WO | WO 2012/049485 A1 | 4/2012 |
| WO | WO 2014/027445 A1 | 2/2014 |

OTHER PUBLICATIONS

International Search Report (ISR) (PCT Form PCT/ISA/210), in PCT/JP2015/005013, dated Oct. 1, 2015.

* cited by examiner

|  | RESERVED BAND WIDTH | BASIC SLOT CYCLE | OPERATION BASIC SLOT NUMBER | TRANSFER OPERATION SUBSLOT PATTERN | | | |
|---|---|---|---|---|---|---|---|
|  |  |  |  | ss0 | ss1 | ss2 | ss3 |
| MASTER A | 10GB/s | 1 | 1 | ○ | ○ | ○ | ○ |
| MASTER B | 5GB/s | 1 | 1 | ○ | × | ○ | × |
| MASTER C | 8GB/s | 4 | 4 | ○ | ○ | ○ | ○ |
| MASTER D | 3GB/s | 2 | 1 | × | ○ | ○ | ○ |

Fig. 8

| | ss0 | ss1 | ss2 | ss3 | ss0 | ss1 | ss2 | ss3 | ss0 | ss1 | ss2 | ss3 | ss0 | ss1 | ss2 | ss3 |
|---|---|---|---|---|---|---|---|---|---|---|---|---|---|---|---|---|
| MASTER A | 10GB/s | 10GB/s | 10GB/s | 10GB/s | 10GB/s | 10GB/s | 10GB/s | 10GB/s | 10GB/s | 10GB/s | 10GB/s | 10GB/s | 10GB/s | 10GB/s | 10GB/s | 10GB/s |
| MASTER B | 5GB/s | 5GB/s | 5GB/s | 5GB/s | 5GB/s | 5GB/s | 5GB/s | 5GB/s | 5GB/s | 5GB/s | 5GB/s | 5GB/s | 5GB/s | 5GB/s | 5GB/s | 0GB/s |
| MASTER C | 0GB/s | 0GB/s | 0GB/s | 0GB/s | 0GB/s | 0GB/s | 0GB/s | 0GB/s | 0GB/s | 0GB/s | 0GB/s | 0GB/s | 8GB/s | 8GB/s | 8GB/s | 8GB/s |
| MASTER D | 0GB/s | 3GB/s | 3GB/s | 3GB/s | 0GB/s | 3GB/s | 3GB/s | 3GB/s | 0GB/s | 0GB/s | 0GB/s | 0GB/s | 0GB/s | 0GB/s | 0GB/s | 0GB/s |

Fig. 9

|  | RESERVED BAND WIDTH | BASIC SLOT CYCLE | OPERATION BASIC SLOT NUMBER | TRANSFER OPERATION SUBSLOT PATTERN | | | |
|---|---|---|---|---|---|---|---|
|  |  |  |  | ss0 | ss1 | ss2 | ss3 |
| MASTER A | 10GB/s | 0 | 0 | ○ | ○ | ○ | ○ |
| MASTER B | 5GB/s | 0 | 0 | ○ | × | ○ | × |
| MASTER C | 8GB/s | 0 | 0 | × | ○ | ○ | ○ |
| MASTER D | 3GB/s | 0 | 0 | × | ○ | × | ○ |

REF REQUEST SUBSLOT NUMBER:0

Fig. 10

|  | ss0 | ss1 | ss2 | ss3 |
|---|---|---|---|---|
| MASTER A | 10GB/s | 10GB/s | 10GB/s | 10GB/s |
| MASTER B | 5GB/s | 0GB/s | 5GB/s | 0GB/s |
| MASTER C | 0GB/s | 8GB/s | 8GB/s | 8GB/s |
| MASTER D | 0GB/s | 3GB/s | 0GB/s | 3GB/s |

REF REQUEST ○

Fig. 11

| | RESERVED BAND WIDTH (ss0) | RESERVED BAND WIDTH (ss1) | RESERVED BAND WIDTH (ss2) | RESERVED BAND WIDTH (ss3) | BASIC SLOT CYCLE | OPERATION BASIC SLOT NUMBER |
|---|---|---|---|---|---|---|
| MASTER A | 10GB/s | 0GB/s | 10GB/s | 10GB/s | 1 | 1 |
| MASTER B | 13GB/s | 10GB/s | 5GB/s | 5GB/s | 1 | 1 |
| MASTER C | 8GB/s | 8GB/s | 8GB/s | 8GB/s | 4 | 4 |
| MASTER D | 0GB/s | 8GB/s | 3GB/s | 3GB/s | 2 | 1 |

Fig. 13

| | ss0 | ss1 | ss2 | ss3 | ss0 | ss1 | ss2 | ss3 | ss0 | ss1 | ss2 | ss3 | ss0 | ss1 | ss2 | ss3 |
|---|---|---|---|---|---|---|---|---|---|---|---|---|---|---|---|---|
| MASTER A | 10GB/s | 0GB/s | 10GB/s | 10GB/s | 0GB/s | 10GB/s | 10GB/s | 10GB/s | 0GB/s | 10GB/s | 10GB/s | 10GB/s | 10GB/s | 0GB/s | 10GB/s | 10GB/s |
| MASTER B | 13GB/s | 10GB/s | 5GB/s | 5GB/s | 13GB/s | 10GB/s | 5GB/s | 5GB/s | 13GB/s | 10GB/s | 5GB/s | 5GB/s | 13GB/s | 10GB/s | 5GB/s | 5GB/s |
| MASTER C | 0GB/s | 0GB/s | 0GB/s | 0GB/s | 0GB/s | 0GB/s | 0GB/s | 0GB/s | 8GB/s | 8GB/s | 0GB/s | 0GB/s | 8GB/s | 8GB/s | 8GB/s | 8GB/s |
| MASTER D | 0GB/s | 8GB/s | 3GB/s | 3GB/s | 0GB/s | 0GB/s | 0GB/s | 0GB/s | 0GB/s | 8GB/s | 3GB/s | 3GB/s | 0GB/s | 0GB/s | 0GB/s | 0GB/s |

Fig. 14

SEMICONDUCTOR DEVICE INCLUDING A REQUEST ISSUING CONTROLLER

TECHNICAL FIELD

The present invention relates to a semiconductor device and more specifically, to a semiconductor device to which a plurality of circuit blocks are connected via a bus.

BACKGROUND ART

In the semiconductor device, a large number of bus systems in which a plurality of bus masters are connected to a common bus have been proposed. In these bus systems, requests sent to the common bus from the plurality of bus masters need to be arbitrated. Patent Literature 1 and 2 disclose examples of the techniques related to performing the arbitration.

Patent Literature 1 discloses a technique of interchanging slots, when there is a request from a master that is designated as a priority master and a slot in which the highest priority is given to the priority master is present in the current slot or a later slot, so as to reduce the latency of the priority master.

Further, Patent Literature 2 discloses a technique of performing, in a circuit composed of multiple masters and multiple slaves connected via an interconnect, a bus arbitration by transmitting token signals between nodes on a virtual network before issuing requests in a physical network.

CITATION LIST

Patent Literature

[Patent Literature 1] Japanese Unexamined Patent Application Publication No. 2005-258867
[Patent Literature 2] International Patent Publication No. WO 2012/049485

SUMMARY OF INVENTION

Technical Problem

In the technique disclosed in Patent Literature 1, the requests from the masters are arbitrated in accordance with priority master information that has been configured for each slot without considering an availability status of a buffer of a memory controller, which causes stagnation of the requests on the bus. Accordingly, a subsequent request having a high priority cannot flow due to the presence of a preceding request having a low priority, which causes a problem that the latency of the request having a high priority is degraded. Further, in order to avoid this problem, an intermediate buffer needs to be provided so that the subsequent request can overtake the preceding request, which causes an increase in the size of the circuit.

Further, in the technique disclosed in Patent Literature 2, the request is issued in the physical network after the arbitration is performed using the token issued in response to a request, which causes a problem that the latency of the circuit is increased. Further, in multiple interconnect layers, the arbitration is performed for each layer, which requires a large number of buffers that store the requests provided in each layer.

The other problems of the related art and the novel characteristics of the present invention will be made apparent from the descriptions of the specification and the accompanying drawings.

Solution to Problem

According to one embodiment, a semiconductor device calculates the number of grantable access rights based on space information of a buffer of a memory controller, selects the master which will be granted the access right based on Quality of Service (QoS) information of a plurality of masters and the number of grantable rights, and does not pass a request from a master which has not been granted the access right.

Advantageous Effects of Invention

According to the embodiment, it is possible to provide a semiconductor device capable of preventing stagnation of requests on a bus, improving the latency, and reducing the size of the circuit.

BRIEF DESCRIPTION OF DRAWINGS

FIG. 8 is a diagram showing a configuration information example of a reservation-type register group according to the second embodiment;
FIG. 9 is a diagram showing a configuration example of a band width in the configuration of FIG. 8 according to the second embodiment;
FIG. 10 is a diagram showing a configuration information example of a reservation-type register group and a refresh request subslot number configuration register according to the second embodiment;
FIG. 11 is a diagram showing a configuration example of a band width in the configuration of FIG. 10 according to the second embodiment;
FIG. 13 is a diagram showing a configuration information example of a reservation-type register group according to the modified example of the second embodiment;
FIG. 14 is a diagram showing a configuration example of a band width in the configuration of FIG. 13 according to the modified example of the second embodiment.

DESCRIPTION OF EMBODIMENTS

Hereinafter, with reference to the drawings, embodiments will be described. The specific values and the like described in the following embodiments are merely examples to facilitate the understanding of the present invention and the present invention is not limited to them unless otherwise stated. Further, in the following description and the drawings, in order to simplify the explanation, matters obvious for those skilled in the art may be omitted or simplified as appropriate.

Further, while various configuration registers are provided in the following embodiments, values or information stored in the respective configuration registers may be changed.

First Embodiment

Figure 1:
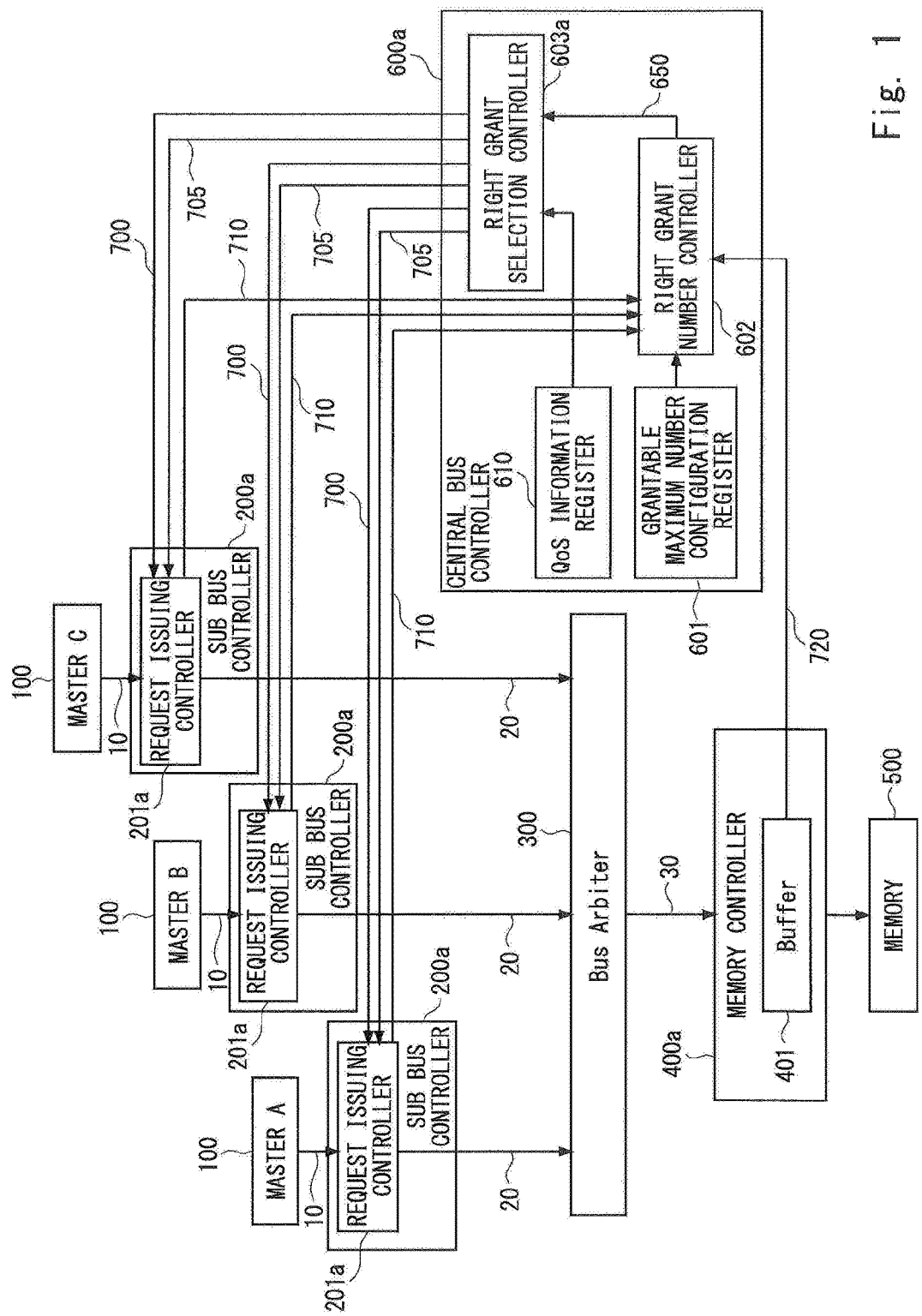
FIG. 1 is a configuration diagram of a semiconductor device according to a first embodiment.

FIG. 1 is a diagram showing a configuration of a semiconductor device according to a first embodiment. As shown in FIG. 1, the semiconductor device according to the first embodiment includes a plurality of masters 100, a plurality of sub bus controllers 200a, a bus arbiter 300, a memory controller 400a, a memory 500, a central bus controller 600a, a bus 10, a bus 20, and a bus 30. While the number of masters 100 is three in the example shown in FIG. 1, the number of masters 100 is not limited and may be any number equal to or larger than two. The three masters 100 shown in FIG. 1 are called a master A, a master B, and a master C. Further, the number of masters 100 is the same as the number of sub bus controllers 200a.

The plurality of masters 100 are connected to the respective sub bus controllers 200a via the bus 10. The plurality of masters 100 output requests for the memory 500 to the respective sub bus controllers 200a via the bus 10.

The sub bus controller 200a includes a request issuing controller 201a. The request issuing controller 201a receives the request from the bus 10. Further, the request issuing controller 201a receives a priority level signal 705 from the central bus controller 600a. The priority level signal 705 is a signal indicating the priority level based on QoS information of the master 100.

Further, the request issuing controller 201a determines whether to output the received request to the bus 20. This determination is made by determining whether an access right grant signal 700 indicating a grant of an access right has been distributed from the central bus controller 600a. When the access right grant signal 700 has been distributed, the request issuing controller 201a outputs the received request to the bus 20. On the other hand, when the access right grant signal 700 has not been distributed, that is, when the access right has not been granted, the request issuing controller 201a does not output the received request to the bus 20. That is, the request issuing controller 201a cannot pass the request from the master 100 until the time it obtains the access right.

When the request issuing controller 201a outputs the received request to the bus 20, the request issuing controller 201a adds the priority level of the corresponding master 100 to this request and outputs the resulting request. This priority level is indicated by the priority level signal 705. Further, when the request issuing controller 201a has not received the request from the bus 10 when it acquired the access right, the request issuing controller 201a returns the access right to the central bus controller 600a by an access right return signal 710.

The bus arbiter 300 receives requests from the bus 20. Further, the bus arbiter 300 arbitrates the requests using the priority levels added to the received requests. The method of arbitrating the requests using the priority levels by the bus arbiter 300 is a known one and thus the description thereof will be omitted. As a result of the arbitration, the bus arbiter 300 outputs the request whose priority is the highest among the requests from the plurality of masters 100 to the bus 30. The arbitration performed by the bus arbiter 300 may be a round robin method or a fixed priority method.

The memory controller 400a includes a buffer 401. The memory controller 400a receives the requests from the bus 30. Further, the memory controller 400a stores the received requests in the buffer 401. The memory controller 400a then schedules the requests and controls the access to the memory 500 using the priority levels added to the requests stored in the buffer 401. Further, the memory controller 400a constantly monitors the use state of the buffer 401. When the buffer 401 is released as a result of completion of response processing, the memory controller 400a outputs information indicating that the buffer 401 has been released to the central bus controller 600a as a buffer release notification signal 720.

The memory 500 is, for example, a Double-Data-Rate Synchronous Dynamic Random Access Memory (DDR SDRAM), a Static Random Access Memory (SRAM) or the like. The memory 500 is not limited to the DDR SDRAM or the SRAM and may be another memory.

The central bus controller 600a is a function unit to control the access right. The central bus controller 600a includes a grantable maximum number configuration register 601, a right grant number controller 602, a right grant selection controller 603a, and a QoS information register 610.

The grantable maximum number configuration register 601 stores the maximum number of the grantable access rights. The maximum number of the grantable access rights indicates the maximum number of the access rights that can be granted. The value of the maximum number of the grantable rights stored in the grantable maximum number configuration register 601 can be changed.

When the buffer 401 has been released, the right grant number controller 602 receives the buffer release notification signal 720 from the memory controller 400a. The right grant number controller 602 then calculates the number of grantable access rights based on the space information of the buffer 401. Further, the right grant number controller 602 outputs the number of grantable rights that has been calculated to the right grant selection controller 603a.

A specific example of the calculation of the number of grantable access rights will be described. The right grant number controller 602 reads out, besides the buffer release notification signal 720, the maximum number of the grantable rights from the grantable maximum number configuration register 601. The right grant number controller 602 then calculates the number of grantable access rights based on the space information of the buffer 401, the upper limit of the number of grantable rights being the maximum number of the grantable rights.

Further, the right grant number controller 602 receives, besides the buffer release notification signal 720, the access right return signal 710 from the request issuing controller 201a. Then the right grant number controller 602 calculates the number of grantable access rights based on the space information of the buffer 401 and the number of access rights that have been returned.

Further, the right grant number controller 602 may calculate the number of grantable access rights using, besides the buffer release notification signal 720, the maximum number of the grantable rights, the access right return signal 710, and the number of access rights that have been distributed. Specifically, when the access right grant signal 700 is distributed based on the maximum number of the grantable rights, the right grant number controller 602 reduces the number of grantable rights by the number corresponding to the number of rights that have been distributed. Further, the right grant number controller 602 increases the number of grantable rights by receiving the buffer release notification signal 720 from the memory controller 400a or by receiving the access right return signal 710 from the request issuing controller 201a. The right grant number controller 602 may recognize the number of access rights that have been distributed by receiving a notification indicating the number of access rights that have been distributed from the right grant selection controller 603a. Further, the right grant number controller 602 may recognize the number of grantable rights that have been output to the right grant selection controller 603a as the number of access rights that have been distributed. This technique is effective when the right grant selection controller 603a definitely distributes all the access rights that can be granted.

The QoS information register 610 stores the QoS information of the plurality of masters 100.

The right grant selection controller 603a reads out the QoS information of the plurality of masters 100 from the QoS information register 610. Further, the right grant selection controller 603a receives the number of grantable rights from the right grant number controller 602. The right grant selection controller 603a then selects a master which will be granted the access right based on the QoS information of the plurality of masters 100 and the number of grantable rights. Specifically, the right grant selection controller 603a selects the master which will be granted the access right so that the master 100 that has a high priority level based on the QoS information is preferentially granted the access right in the range of the number of grantable rights.

Further, the right grant selection controller 603a distributes the access right grant signal 700 to the master 100 that has been selected as a master which will be granted the access right. Specifically, the right grant selection controller 603a outputs the access right grant signal 700 to the sub bus controller 200a of the master 100 that has been selected. The selection of the master which will be granted the access right and the output of the access right grant signal 700 in the right grant selection controller 603a are performed at every cycle. Further, the right grant selection controller 603a outputs the priority level signal 705 indicating the priority level based on the QoS information of the master 100 to the sub bus controller 200a of the master 100. The output of the priority level signal 705 by the right grant selection controller 603a is performed when the QoS information is stored in the QoS information register 610. Accordingly, the priority level based on the QoS information stored in the QoS information register 610 is also reflected in the sub bus controller 200a.

Figure 2:
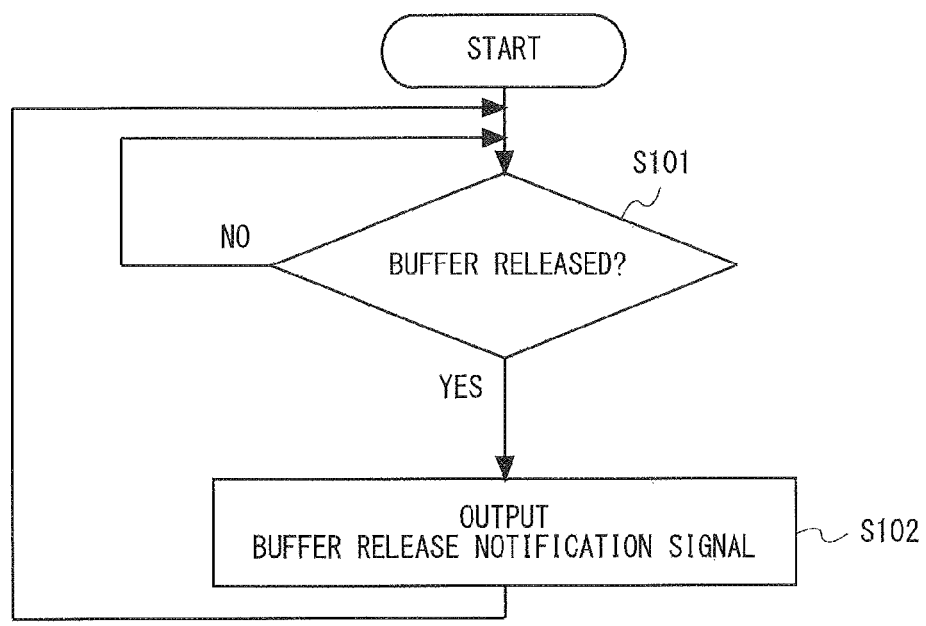
FIG. 2 is a flowchart showing one example of processing of a memory controller regarding an access right according to the first embodiment.

Next, with reference to FIGS. 2, 3, and 4, examples of the process flows of the memory controller 400a, the central bus controller 600a, and the sub bus controller 200a regarding the access right in the semiconductor device according to the first embodiment will be described.

First, with reference to a flowchart shown in FIG. 2, the process flow of the memory controller 400a regarding the access right will be described.

First, the memory controller 400a monitors whether the buffer 401 has been released (S101). When it is determined in S101 that the buffer 401 has not yet been released, the monitoring in S101 is continued.

When it is determined in S101 that the buffer 401 has been released, the memory controller 400a outputs the release information of the buffer 401 to the central bus controller 600a as the buffer release notification signal 720 (S102) and the process goes back to S101.

Next, with reference to the flowchart shown in FIG. 3, a process flow of the central bus controller 600a regarding the access right will be described.

First, the right grant number controller 602 determines whether it has received the buffer release notification signal 720 (S201). When the right grant number controller 602 determines in S201 that it has received the buffer release notification signal 720, the right grant number controller 602 increases the number of grantable rights (S202).

After S202, the right grant number controller 602 determines whether it has received the access right return signal 710 (S203). When it is determined in S201 that it has not received the buffer release notification signal 720, the process also goes to S203. When it is determined in S203 that the right grant number controller 602 has received the access right return signal 710, the right grant number controller 602 increases the number of grantable rights (S204).

After S204, the right grant selection controller 603a determines whether the right can be granted (S205). When it is determined in S203 that it has not received the access right return signal 710, the process also goes to S205. The determination in S205 is performed by receiving the number of grantable rights from the right grant number controller 602. The determination in S205 is performed at every cycle.

When it is determined in S205 that the right cannot be granted, the process goes back to S201. On the other hand, when it is determined in S205 that the right can be granted, the right grant selection controller 603a selects the master which will be granted the access right (S206). After S206, the right grant selection controller 603a distributes the access right grant signal 700 to the master which will be granted the access right (S207).

After S207, the right grant number controller 602 decreases the number of grantable rights (S208) and the process goes back to S201.

Figure 3:
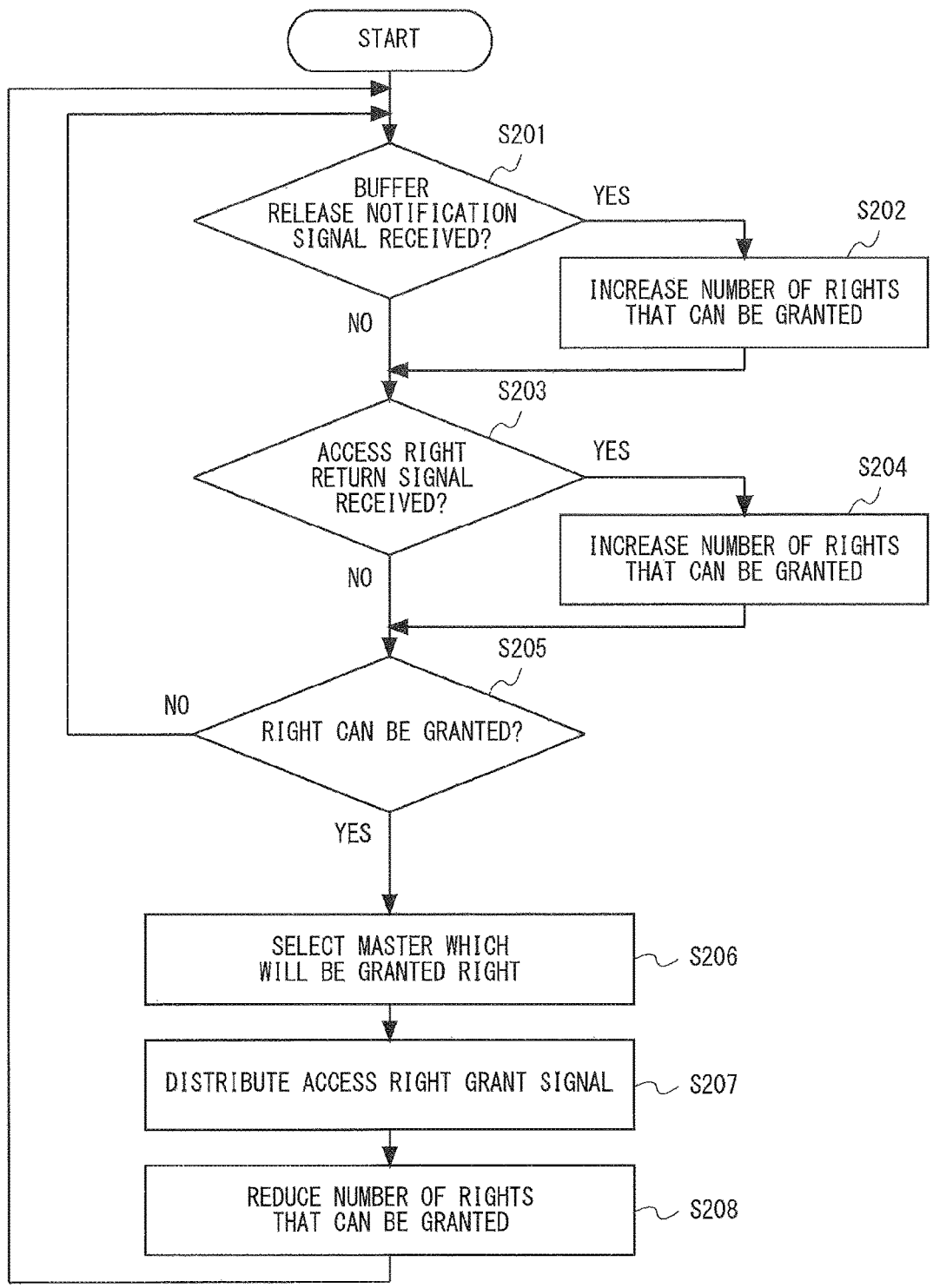
FIG. 3 is a flowchart showing one example of processing of a central bus controller regarding the access right according to the first embodiment.
Figure 4:
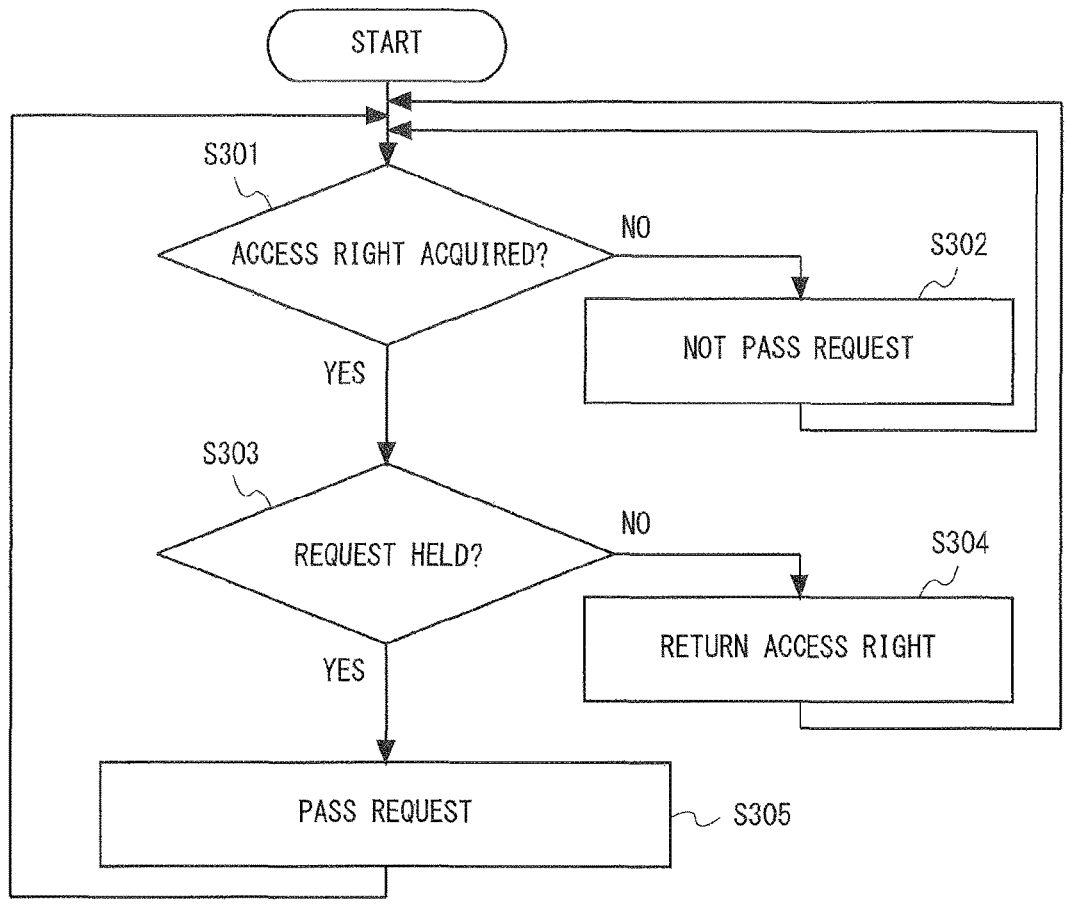
FIG. 4 is a flowchart showing one example of processing of a sub bus controller regarding the access right according to the first embodiment.

While S201 is performed earlier than S203 in FIG. 3, either one of S201 or S203 may be performed first. Further, while S208 is performed later than S207 in FIG. 3, S208 may be performed earlier than S207. The right grant number controller 602 may decrease the number of grantable rights when, for example, it outputs the number of grantable rights to the right grant selection controller 603a.

Next, with reference to a flowchart shown in FIG. 4, a process flow of the sub bus controller 200a regarding the access right will be described.

First, the request issuing controller 201a determines whether it has acquired the access right (S301). When it is determined in S301 that it has not acquired the access right, the request issuing controller 201a does not pass the request from the master 100 (S302) and the process goes back to S301.

On the other hand, when it is determined in S301 that the request issuing controller 201a has acquired the access right, the request issuing controller 201a determines whether it holds the request received from the master 100 (S303). When it is determined in S303 that it does not hold the request, the request issuing controller 201a returns the access right to the right grant number controller 602 (S304). On the other hand, when it is determined in S303 that it holds the request, the request issuing controller 201a passes the request (S305). That is, the request issuing controller 201a outputs the request to the bus 20. The process then goes back to S301.

As described above, in the semiconductor device according to the first embodiment, the availability status of the buffer 401 of the memory controller 400a is monitored and the requests from all the masters 100 are controlled using the access right by the central bus controller 600a. It is therefore possible to achieve total optimization control.

Further, the number of access rights to be distributed is controlled by the right grant number controller 602. It is thus possible to control the number of requests that are stagnated in the whole bus system.

Further, the grantable maximum number configuration register 601 is configured to be able to set the maximum number of the grantable access rights. It is therefore possible to perform control to definitely prevent the congestion of the bus when the maximum number is set to a number equal to the number of buffers 401 of the memory controller 400a. Further, by setting the maximum number to a number larger than the number of buffers 401 of the memory controller 400a, it is possible to perform control in consideration of the requests that can be present in an intermediate bus.

Further, when the request issuing controller 201a does not hold the request from the master 100 to which the access right has been granted, the access right is returned. It is thus possible to increase the number of grantable rights by the number corresponding to the number of rights that have been returned.

Second Embodiment

Figure 5:
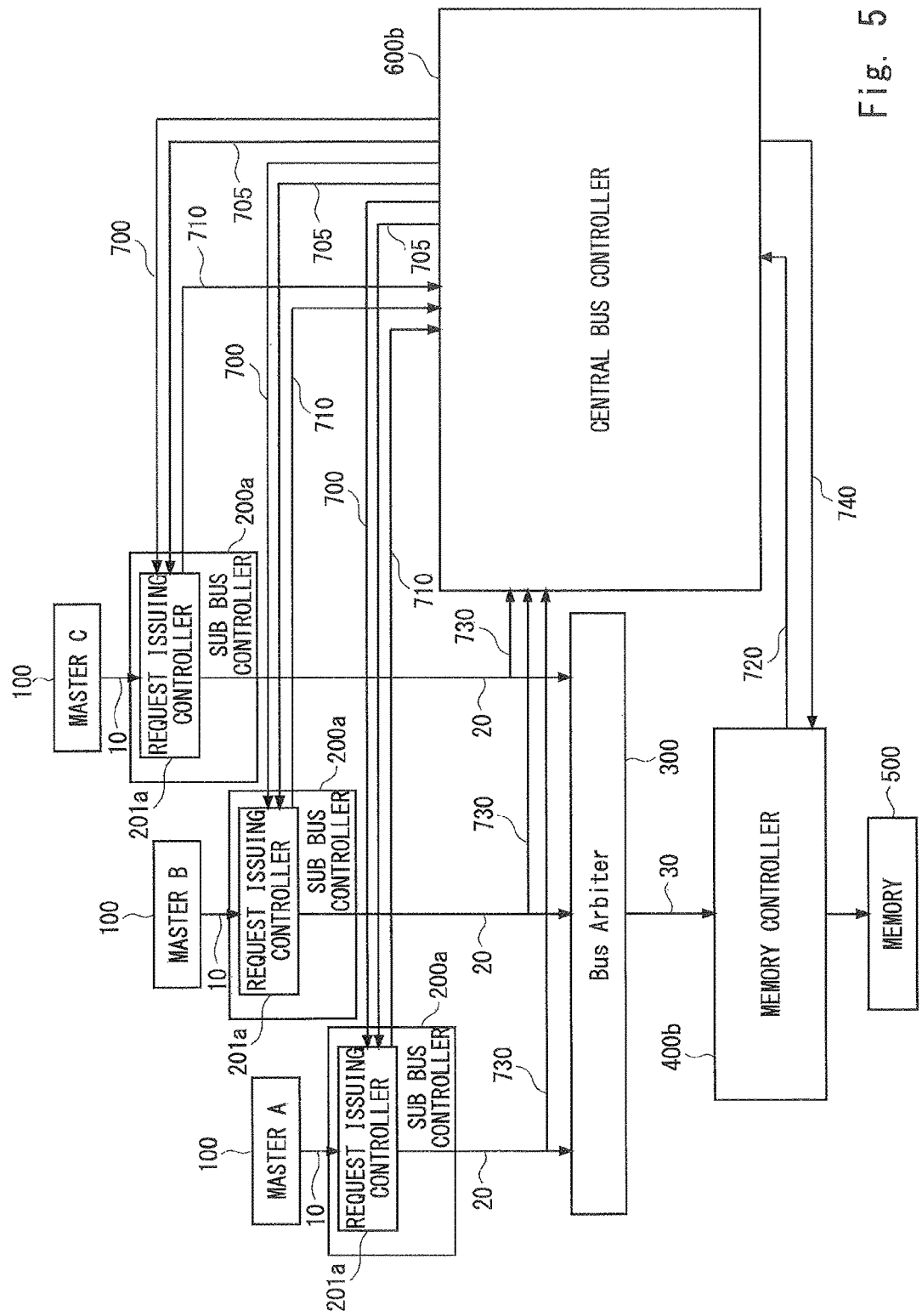
FIG. 5 is a configuration diagram of a semiconductor device according to a second embodiment.

Next, a semiconductor device according to a second embodiment will be described. As shown in FIG. 5, the semiconductor device according to the second embodiment includes a plurality of masters 100, a plurality of sub bus controllers 200a, a bus arbiter 300, a memory controller 400b, a memory 500, a central bus controller 600b, a bus 10, a bus 20, and a bus 30. Since the configurations of the plurality of masters 100, the plurality of sub bus controllers 200a, the bus arbiter 300, the memory 500, the bus 10, the bus 20, and the bus 30 are the same as those shown in the first embodiment, the descriptions thereof will be omitted.

Figure 6:
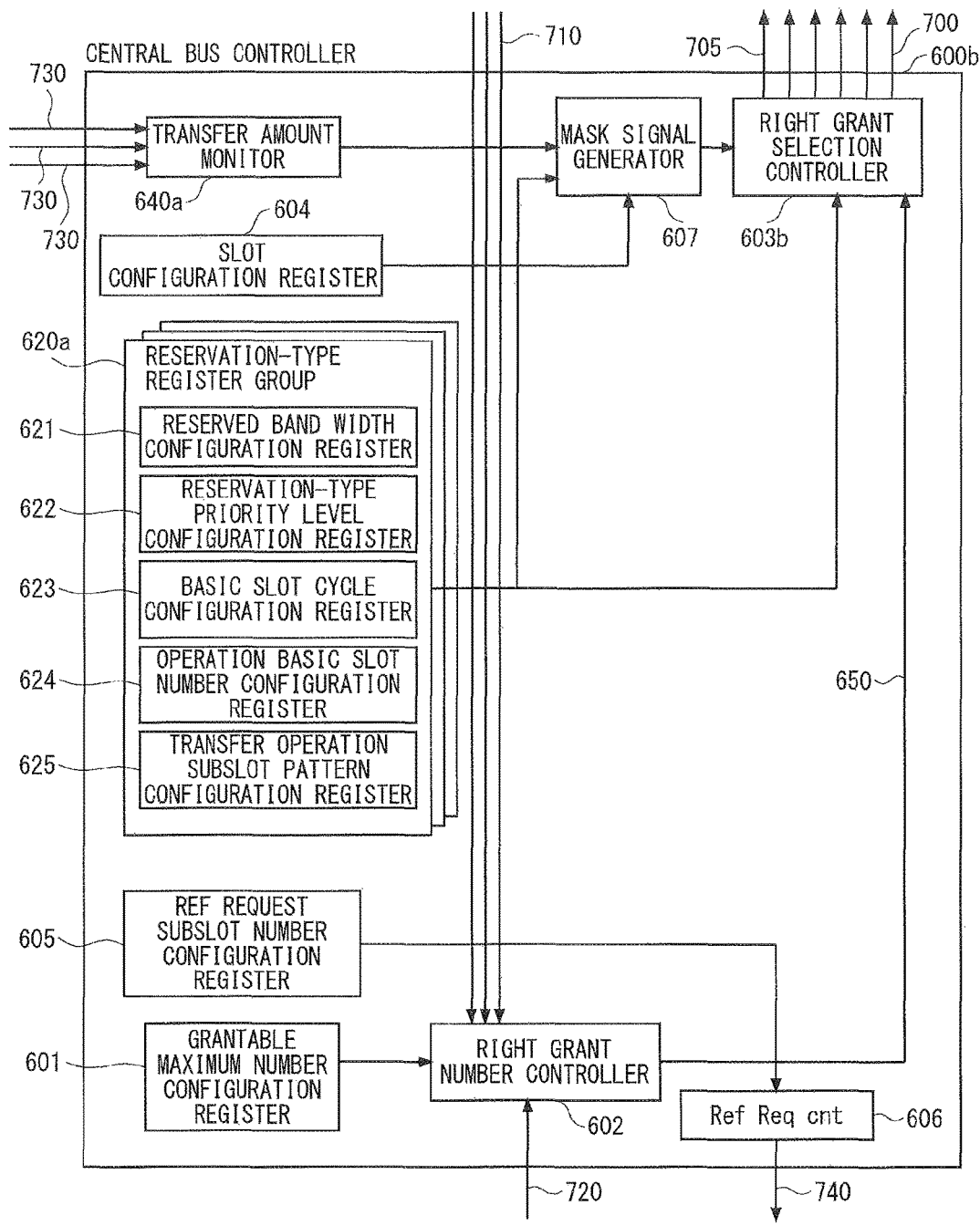
FIG. 6 is a configuration diagram of a central bus controller according to the second embodiment.

Next, with reference to FIG. 6, the central bus controller 600b will be described. As shown in FIG. 6, the central bus controller 600b includes a grantable maximum number configuration register 601, a right grant number controller 602, a right grant selection controller 603b, a slot configuration register 604, a refresh request subslot number configuration register 605, a refresh request controller 606, a mask signal generator 607, a reservation-type register group 620a, and a transfer amount monitor 640a. Since the configurations of the grantable maximum number configuration register 601 and the right grant number controller 602 are the same as those shown in the first embodiment, the descriptions thereof will be omitted. The reservation-type register group may be called a first configuration register group.

The slot configuration register 604 stores the number of subslots that are present in one basic slot and the period of one subslot. The basic slot indicates the refresh period of the memory 500. The number of subslots that are present in one basic slot and the period of one subslot stored in the slot configuration register 604 may be changed.

The refresh request subslot number configuration register 605 stores the subslot number in which the refresh request controller 606 outputs a refresh request signal 740. The subslot number stored in the refresh request subslot number configuration register 605 can be changed.

The refresh request controller 606 reads out the subslot number stored in the refresh request subslot number configuration register 605. Further, the refresh request controller 606 outputs the refresh request signal 740 to the memory controller 400b in the subslot indicated by the subslot number that has been read out.

The transfer amount monitor 640a is a function unit that measures the amount of the requests to be transferred to the bus arbiter 300 from the plurality of masters 100 via the respective sub bus controllers 200a. The transfer amount monitor 640a measures the amount of requests transferred from the plurality of masters 100 by a monitor signal 730 from the plurality of buses 20. The transfer amount monitor 640a then outputs the amount of requests transferred from the plurality of masters 100 that has been measured to the mask signal generator 607.

The reservation-type register group 620a includes a reserved band width configuration register 621, a reservation-type priority level configuration register 622, a basic slot cycle configuration register 623, an operation basic slot number configuration register 624, and a transfer operation subslot pattern configuration register 625.

In the example shown in FIG. 6, the central bus controller 600b includes the reservation-type register groups 620a whose number is equal to the number of masters 100. The relation between the plurality of masters 100 and the reservation-type register group 620a may be any one of the following relations.

For example, dedicated reservation-type register groups 620a may be used for the plurality of masters 100. Specifically, when there are three masters (master A, master B, and master C), the central bus controller 600b may include three reservation-type register groups 620a: the reservation-type register group 620a dedicated for the master A, the reservation-type register group 620a dedicated for the master B, and the reservation-type register group 620a dedicated for the master C. Further, the reservation-type register groups 620a may not be dedicated for the respective masters 100. The central bus controller 600b may include a plurality of reservation-type register groups 620a and associate the plurality of reservation-type register groups 620a with the plurality of masters 100. Further, the central bus controller 600b may include one reservation-type register group 620a and configuration registers in the reservation-type register group 620a may store information regarding the plurality of respective masters 100. Further, the configuration registers in the reservation-type register group 620a may include the configuration registers separately provided for the plurality of respective masters 100 and the configuration registers that store information on the plurality of masters 100 in one configuration register.

The reserved band width configuration register 621 stores the reserved band widths of the plurality of masters 100. The reserved band width indicates, for example, the reserved transfer amount for one subslot in the master 100.

The reservation-type priority level configuration register 622 stores the priority levels of the plurality of masters 100.

The basic slot cycle configuration register 623 stores, for each of the plurality of masters 100, the cycle of the basic slot in which the access right is distributed. When 1 is stored in the basic slot cycle configuration register 623, for example, the distribution of the access right becomes effective in each basic slot and when 2 is stored in the basic slot cycle configuration register 623, the distribution of the access right becomes effective once in two basic slots.

The operation basic slot number configuration register 624 stores, for each of the plurality of masters 100, the basic slot number in which the access right is distributed. When 1 is stored in the operation basic slot number configuration register 624, for example, the distribution of the access right in the first basic slot is validated and when 2 is stored therein, the distribution of the access right in the second basic slot is validated.

The transfer operation subslot pattern configuration register 625 stores, for each of the plurality of masters 100, the subslot pattern in which the access right is distributed. Specifically, the transfer operation subslot pattern configuration register 625 stores information regarding whether the distribution of the access right in each subslot that forms the basic slot is possible as the subslot pattern in which the access right is distributed. The transfer operation subslot pattern configuration register 625 stores, for example, O in the subslot in which the access right can be distributed and stores x in the subslot in which the access right cannot be distributed.

The mask signal generator 607 receives the amount of requests transferred from the plurality of masters 100 from the transfer amount monitor 640a. Further, the mask signal generator 607 reads out the number of subslots that are present in one basic slot and the period of one subslot from the slot configuration register 604. Further, the mask signal generator 607 reads out the reserved band widths of the plurality of masters 100 from the reserved band width configuration register 621. Then the mask signal generator 607 generates a mask signal of the access right grant signal 700 using the number of subslots that are present in one basic slot and the period of one subslot, the amount of requests transferred from the plurality of masters 100, and the reserved band widths of the plurality of masters 100. Further, the mask signal generator 607 outputs the mask signal that has been generated to the right grant selection controller 603b.

The method of generating the mask signal of the access right grant signal 700 will be described. The mask signal generator 607 sets, using the number of subslots that are present in one basic slot and the period of one subslot read out from the slot configuration register 604, the number of subslots that are present in one basic slot and the period of one subslot in the mask signal generator 607. Further, when the amount of the requests transferred from one master 100 has reached the reserved transfer amount of this master 100, the mask signal generator 607 generates, for this master 100, the mask signal regarding the remaining period of the subslot.

The right grant selection controller 603b reads out the reserved band widths of the plurality of masters 100 from the reserved band width configuration register 621. Further, the right grant selection controller 603b reads out the priority levels of the plurality of masters 100 from the reservation-type priority level configuration register 622. Further, the right grant selection controller 603b reads out, for each of the plurality of masters 100, the basic slot cycle in which the access right is distributed from the basic slot cycle configuration register 623. Further, the right grant selection controller 603b reads out, for each of the plurality of masters 100, the basic slot number in which the access right is distributed from the operation basic slot number configuration register 624. Further, the right grant selection controller 603b reads out, for each of the plurality of masters 100, the subslot pattern in which the access right is distributed from the transfer operation subslot pattern configuration register 625. Further, the right grant selection controller 603b receives the mask signal from the mask signal generator 607. Further, the right grant selection controller 603b receives the number of grantable rights from the right grant number controller 602.

The right grant selection controller 603b then selects the master which will be granted the access right using the reserved band widths of the plurality of masters 100, the priority levels of the plurality of masters 100, the basic slot cycles of the plurality of masters 100, the basic slot numbers of the plurality of masters 100, the subslot patterns of the plurality of masters 100, the mask signal, and the number of grantable rights. The method of selecting the master which will be granted the access right by the right grant selection controller 603b will be described later in detail with reference to FIGS. 8 and 9.

Further, the right grant selection controller 603b distributes the access right grant signal 700 to the master 100 that has been selected as a master which will be granted the access right. Specifically, the right grant selection controller 603b outputs the access right grant signal 700 to the sub bus controller 200a of the master that has been selected. The selection of the master which will be granted the access right and the output of the access right grant signal 700 in the right grant selection controller 603b are performed at every cycle. Further, the right grant selection controller 603b outputs the priority level signal 705 indicating the priority level of the master 100 to the sub bus controller 200a of the master 100. The output of the priority level signal 705 in the right grant selection controller 603b is performed when the priority level is stored in the reservation-type priority level configuration register 622. Accordingly, the priority level stored in the reservation-type priority level configuration register 622 is reflected also in the sub bus controller 200a.

Figure 7:
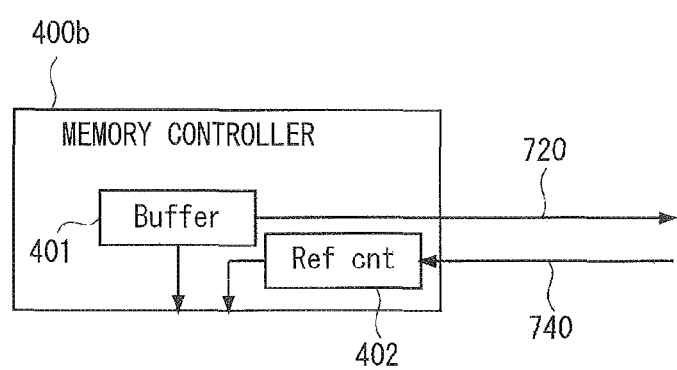
FIG. 7 is a configuration diagram of a memory controller according to the second embodiment.

Next, with reference to FIG. 7, the memory controller 400b will be described. As shown in FIG. 7, the memory controller 400b includes a buffer 401 and a refresh controller 402. Since the configuration of the buffer 401 is the same as that in the first embodiment, the descriptions thereof will be omitted.

The refresh controller 402 receives the refresh request signal 740 from the refresh request controller 606. Upon receiving the refresh request signal 740, the refresh controller 402 outputs a refresh command to the memory 500 to refresh the memory 500.

Next, with reference to FIGS. 8 and 9, a method of selecting the master which will be granted the access right by the right grant selection controller 603b will be described. In FIGS. 8 and 9, four masters: a master A, a master B, a master C, and a master D, are used as the plurality of masters 100.

With reference first to FIG. 8, an example of the configuration information of the reservation-type register group in the second embodiment will be described.

The reserved band width configuration register 621 stores 10 GB/s (gigabytes per second), 5 GB/s, 8 GB/s, and 3 GB/s as the reserved band widths of the master A, the master B, the master C, and the master D, respectively.

The basic slot cycle configuration register 623 stores 1, 1, 4, and 2 as the basic slot cycles of the master A, the master B, the master C, and the master D, respectively.

The operation basic slot number configuration register 624 stores 1, 1, 4, and 1 as the operation basic slot numbers of the master A, the master B, the master C, and the master D, respectively.

The transfer operation subslot pattern configuration register 625 stores O, O, O, O as the transfer operation subslot patterns in the subslot 0 (ss0), the subslot 1, the subslot 2, and the subslot 3 of the master A. Further, the transfer operation subslot pattern configuration register 625 stores O, x, O, x as the transfer operation subslot patterns in the subslot 0, the subslot 1, the subslot 2, and the subslot 3 of the master B. Further, the transfer operation subslot pattern configuration register 625 stores O, O, O, O as the transfer operation subslot patterns in the subslot 0, the subslot 1, the subslot 2, and the subslot 3 of the master C. Further, the transfer operation subslot pattern configuration register 625 stores x, O, O, O as the transfer operation subslot patterns in the subslot 0, the subslot 1, the subslot 2, and the subslot 3 of the master D.

With reference next to FIG. 9, the selection of the master which will be granted the right in the configuration shown in FIG. 8 will be described. In the example shown in FIG. 9, the present invention will be described below with the assertion that there are a sufficient number of grantable rights. When the number of grantable rights is insufficient, the selection of the master which will be granted the right is performed using the table shown in FIG. 9 and the priority levels of the plurality of masters 100.

The right grant selection controller 603b distributes the access right to the master A in each subslot of each basic slot. Further, the right grant selection controller 603b distributes the access right to the master B in the subslots 0 and 2 of each basic slot. Further, the right grant selection controller 603b distributes the access right to the master C in each subslot of the fourth basic slot in four basic slot cycles. Further, the right grant selection controller 603b distributes the access right to the master D in the subslots 1 to 3 of the first basic slot in two basic slot cycles.

That is, the right grant selection controller 603b selects the master A and the master B as the masters which will be granted the right in the subslot 0 of the first basic slot and selects the master A and the master D as the masters which will be granted the right in the subslot 1 of the first basic slot. In the other slots as well, the right grant selection controller 603b selects the master 100 in which the band width is configured as the master which will be granted the right.

Further, when the right grant selection controller 603b receives the mask signal for one of the masters 100, the right grant selection controller 603b eliminates this master 100 from the target to which the access right is to be distributed in the remaining period of the subslot.

With reference next to FIGS. 10 and 11, a band width control in consideration of the refresh of the memory will be described.

First, with reference to FIG. 10, an example of the configuration information of the reservation-type register group and the refresh request subslot number configuration register according to the second embodiment will be described. In the example shown in FIG. 10, for the sake of simplicity of the description, the basic slot cycle and the operation basic slot number are set to 0.

The reserved band width configuration register 621 stores 10 GB/s, 5 GB/s, 8 GB/s, and 3 GB/s as the reserved band widths of the master A, the master B, the master C, and the master D, respectively.

The transfer operation subslot pattern configuration register 625 stores O, O, O, O as the transfer operation subslot patterns in the subslot 0, the subslot 1, the subslot 2, and the subslot 3 of the master A. Further, the transfer operation subslot pattern configuration register 625 stores O, x, O, x as the transfer operation subslot patterns in the subslot 0, the subslot 1, the subslot 2, and the subslot 3 of the master B. Further, the transfer operation subslot pattern configuration register 625 stores x, O, O, O as the transfer operation subslot patterns in the subslot 0, the subslot 1, the subslot 2, and the subslot 3 of the master C. Further, the transfer operation subslot pattern configuration register 625 stores x, O, x, O as the transfer operation subslot patterns in the subslot 0, the subslot 1, the subslot 2, and the subslot 3 of the master D.

The refresh request subslot number configuration register 605 stores 0 as the subslot number in which the refresh request controller 606 outputs the refresh request signal 740.

With reference next to FIG. 11, the selection of the master which will be granted the right in the configuration shown in FIG. 10 will be described.

The right grant selection controller 603b distributes the access right to the master A in each subslot. Further, the right grant selection controller 603b distributes the access right to the master B in the subslot 0 and the subslot 2. Further, the right grant selection controller 603b distributes the access right to the master C in the subslots 1 to 3. Further, the right grant selection controller 603b distributes the access right to the master D in the subslot 1 and the subslot 3.

That is, the right grant selection controller 603b selects the master A and the master B as the masters which will be granted the right in the subslot 0. Further, the right grant selection controller 603b selects the master A, the master C, and the master D as the masters which will be granted the right in the subslot 1. Further, the right grant selection controller 603b selects the master A, the master B, and the master C as the masters which will be granted the right in the subslot 2. Further, the right grant selection controller 603b selects the master A, the master C, and the master D as the masters which will be granted the right in the subslot 3.

Therefore, the configuration band width of the subslot 0 is 15 GB/s, the configuration band width of the subslot 1 is 21 GB/s, the configuration band width of the subslot 2 is 23 GB/s, and the configuration band width of the subslot 3 is 21 GB/s. Therefore, the configuration band width of the subslot in which the refresh operation is performed becomes smaller than the configuration band width of the other subslots.

As described above, in the semiconductor device according to the second embodiment, the configuration band width in each subslot is limited by the transfer amount monitor 640a and the reserved band width configuration register 621. It is therefore possible to limit the number of requests from the respective masters 100 so that the masters 100 do not transfer requests larger than necessary. Further, since the configured band width is configured to be acquired in the subslot, a certain level of latency can be guaranteed.

Further, the mask signal generator 607 generates, for the master 100 that has transferred the requests whose number corresponding to the reserved transfer amount, a mask signal for the remaining period of the subslot. It is therefore possible to limit the number of requests from the master 100 to be transferred so that this number does not exceed the reserved transfer amount.

Further, the slot configuration register 604, the basic slot cycle configuration register 623, the operation basic slot number configuration register 624, and the transfer operation subslot pattern configuration register 625 configure the subslots and the basic slots in which the access right is granted to the plurality of masters 100. It is therefore possible to program the order in which the masters transfer the requests and the combinations of the masters that send the requests at the same time, so that the band width control in accordance with the system can be performed.

Further, the timing when the refresh is issued can be controlled by the refresh request controller 606, the refresh request subslot number configuration register 605, and the refresh controller 402. It is therefore possible to reduce the whole request band width for the subslot in which the memory access cannot be performed due to the performance of the refresh and to perform the band width control in consideration of the refresh.

Further, a configuration in which the plurality of reservation-type register groups 620a and the plurality of masters 100 are associated with each other may be employed. Accordingly, even when the number of reservation-type register groups 620a is not made equal to the number of masters 100, a similar control can be performed.

Modified Example of Second Embodiment

Next, a modified example of the second embodiment will be described. In the modified example of the second embodiment, a central bus controller 600c is used in place of the central bus controller 600b of the second embodiment. Since the configurations other than the configuration of the central bus controller are similar to those shown in the second embodiment, the descriptions thereof will be omitted.

Figure 12:
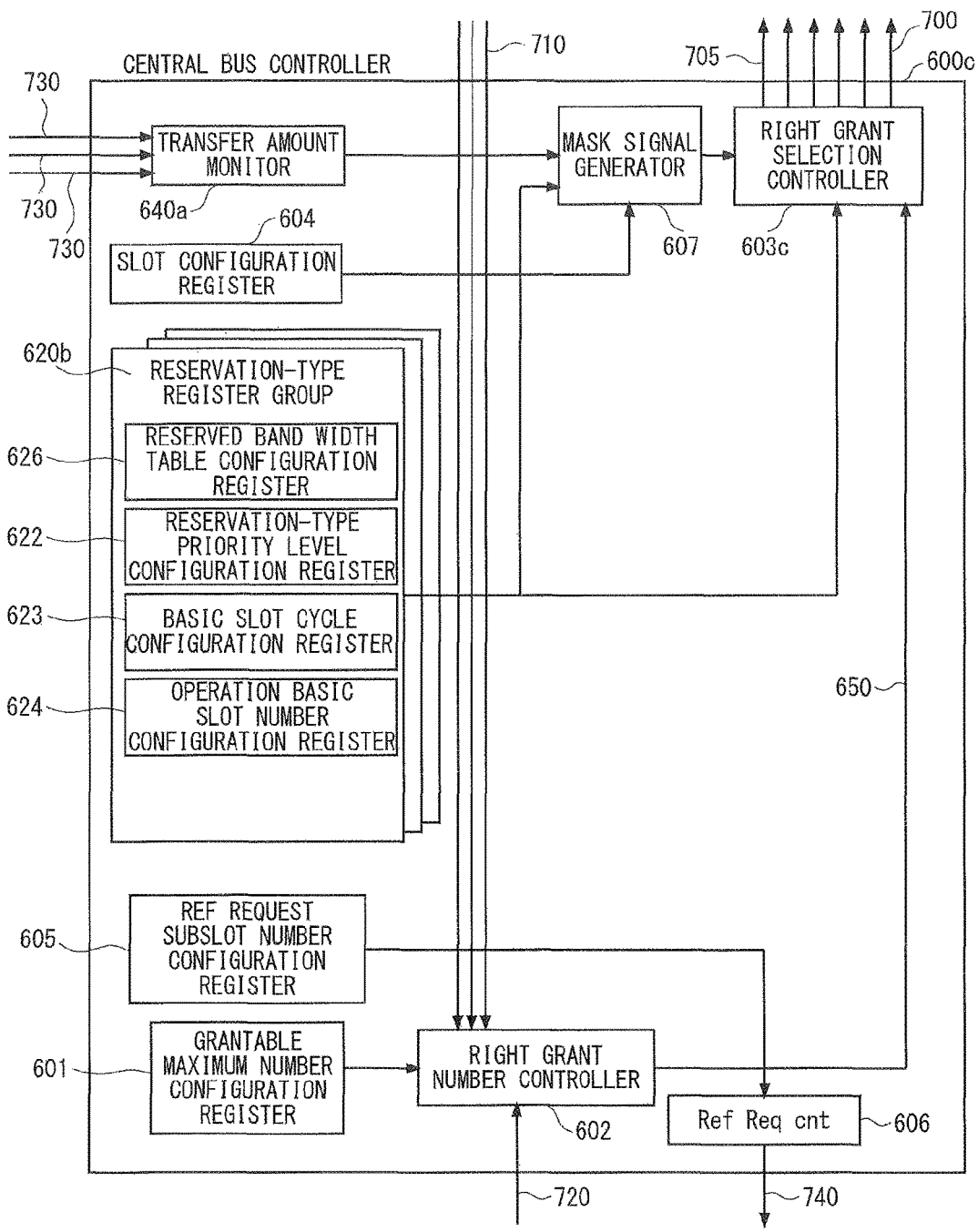
FIG. 12 is a configuration diagram of a central bus controller according to a modified example of the second embodiment.

With reference next to FIG. 12, the central bus controller 600c will be described. As shown in FIG. 12, the central bus controller 600c includes a grantable maximum number configuration register 601, a right grant number controller 602, a right grant selection controller 603c, a slot configuration register 604, a refresh request subslot number configuration register 605, a refresh request controller 606, a mask signal generator 607, a reservation-type register group 620b, and a transfer amount monitor 640a. Since the configurations of the grantable maximum number configuration register 601, the right grant number controller 602, the slot configuration register 604, the refresh request subslot number configuration register 605, the refresh request controller 606, the mask signal generator 607, and the transfer amount monitor 640a are the same as those shown in the second embodiment, the descriptions thereof will be omitted.

The reservation-type register group 620b includes a reservation-type priority level configuration register 622, a basic slot cycle configuration register 623, an operation basic slot number configuration register 624, and a reserved band width table configuration register 626. Since the configurations of the reservation-type priority level configuration register 622, the basic slot cycle configuration register 623, and the operation basic slot number configuration register 624 are the same as those shown in the second embodiment, the descriptions thereof will be omitted. Further, since a relation between the plurality of masters 100 and the reservation-type register group 620b is the same as the relation between the plurality of masters 100 and the reservation-type register group 620a, the descriptions thereof will be omitted.

The reserved band width table configuration register 626 stores, for the plurality of masters 100, the reserved band width for each subslot in the basic slot.

The right grant selection controller 603c reads out the priority levels of the plurality of masters 100 from the reservation-type priority level configuration register 622. Further, the right grant selection controller 603c reads out, for each of the plurality of masters 100, the basic slot cycle in which the access right is distributed from the basic slot cycle configuration register 623. Further, the right grant selection controller 603c reads out, for each of the plurality of masters 100, the basic slot number in which the access right is distributed from the operation basic slot number configuration register 624. Further, the right grant selection controller 603c reads out the reserved band width for each subslot in the plurality of masters 100 from the reserved band width table configuration register 626. Further, the right grant selection controller 603c receives the mask signal from the mask signal generator 607. Further, the right grant selection controller 603c receives the number of grantable rights from the right grant number controller 602.

The right grant selection controller 603c selects the master which will be granted the access right using the priority levels of the plurality of masters 100, the basic slot cycles of the plurality of masters 100, the basic slot numbers of the plurality of masters 100, the reserved band widths of the plurality of masters 100 for each subslot, the mask signal, and the number of grantable rights.

Further, the right grant selection controller 603c distributes the access right grant signal 700 to the master 100 that has been selected as a master which will be granted the access right. Specifically, the right grant selection controller 603c outputs the access right grant signal 700 to the sub bus controller 200a of the master 100 that has been selected. Further, the right grant selection controller 603c outputs, besides the access right grant signal 700, the priority level of the master 100 that has been selected to the sub bus controller 200a of the master 100 that has been selected. The selection of the master which will be granted the access right and the output of the access right grant signal 700 in the right grant selection controller 603c are performed at every cycle. Further, the right grant selection controller 603c outputs the priority level signal 705 indicating the priority level of the master 100 to the sub bus controller 200a of this master 100. The output of the priority level signal 705 in the right grant selection controller 603c is performed when the priority level is stored in the reservation-type priority level configuration register 622. Accordingly, the priority level stored in the reservation-type priority level configuration register 622 is reflected also in the sub bus controller 200a.

With reference next to FIGS. 13 and 14, the method of selecting the master which will be granted the access right by the right grant selection controller 603c will be described. In FIGS. 13 and 14, four masters (master A, master B, master C, and master D) are used as the plurality of masters 100.

With reference first to FIG. 13, an example of the configuration information of the reservation-type register group according to the modified example of the second embodiment will be described.

The reserved band width table configuration register 626 stores 10 GB/s, 0 GB/s, 10 GB/s, and 10 GB/s as the reserved band widths of the subslots 0 to 3 in the master A, respectively. Further, the reserved band width table configuration register 626 stores 13 GB/s, 10 GB/s, 5 GB/s, and 5 GB/s as the reserved band widths of the subslots 0 to 3 in the master B, respectively. Further, the reserved band width table configuration register 626 stores 8 GB/s, 8 GB/s, 8 GB/s, and 8 GB/s as the reserved band widths of the subslots 0 to 3 in the master C, respectively. Further, the reserved band width table configuration register 626 stores 0 GB/s, 8 GB/s, 3 GB/s, and 3 GB/s as the reserved band widths of the subslots 0 to 3 in the master D, respectively.

That is, the right grant selection controller 603c configures, for the master B and the master D, different reserved band widths for each subslot in which the access right is distributed.

The basic slot cycle configuration register 623 stores 1, 1, 4, and 2 as the basic slot cycles of the master A, the master B, the master C, and the master D, respectively.

The operation basic slot number configuration register 624 stores 1, 1, 4, and 1 as the operation basic slot numbers of the master A, the master B, the master C, and the master D, respectively.

With reference next to FIG. 14, the selection of the master which will be granted the right in the configuration in FIG. 13 will be described. In the example shown in FIG. 14, the present invention will be described below with the assertion that there are a sufficient number of grantable rights. When the number of grantable rights is insufficient, the selection of the master which will be granted the right is performed using the table shown in FIG. 14 and the priority levels of the plurality of masters 100.

The right grant selection controller 603c distributes the access right to the master A in the subslot 0, the subslot 2, and the subslot 3 of each basic slot. Further, the right grant selection controller 603c distributes the access right to the master B in each subslot of each basic slot. Further, the right grant selection controller 603c distributes the access right to the master C in each subslot of the fourth basic slot in four basic slot cycles. Further, the right grant selection controller 603c distributes the access right to the master D in the subslots 1 to 3 of the first basic slot in two basic slot cycles.

That is, the right grant selection controller 603c selects the master A and the master B as the masters which will be granted the right in the subslot 0 of the first basic slot and selects the master B and the master D as the masters which will be granted the right in the subslot 1 of the first basic slot. In the other slots as well, the right grant selection controller 603c selects the master 100 in which the band width is configured as the master which will be granted the right.

Further, when the right grant selection controller 603c receives the mask signal for one of the masters 100, the right grant selection controller 603c eliminates this master 100 from the target to which the access right is to be distributed in the remaining period of the subslot.

As described above, in the semiconductor device according to the modified example of the second embodiment, the reserved band width table configuration register 626 stores, for the plurality of masters 100, the reserved band width for each subslot. It is therefore possible to configure the band width in accordance with the system in a more flexible way compared to the second embodiment.

Third Embodiment

Next, a third embodiment will be described. In the third embodiment, a central bus controller 600d is used in place of the central bus controller 600b of the second embodiment. Since the configurations other than the configuration of the central bus controller are the same as those in the second embodiment, the descriptions thereof will be omitted.

Figure 15:
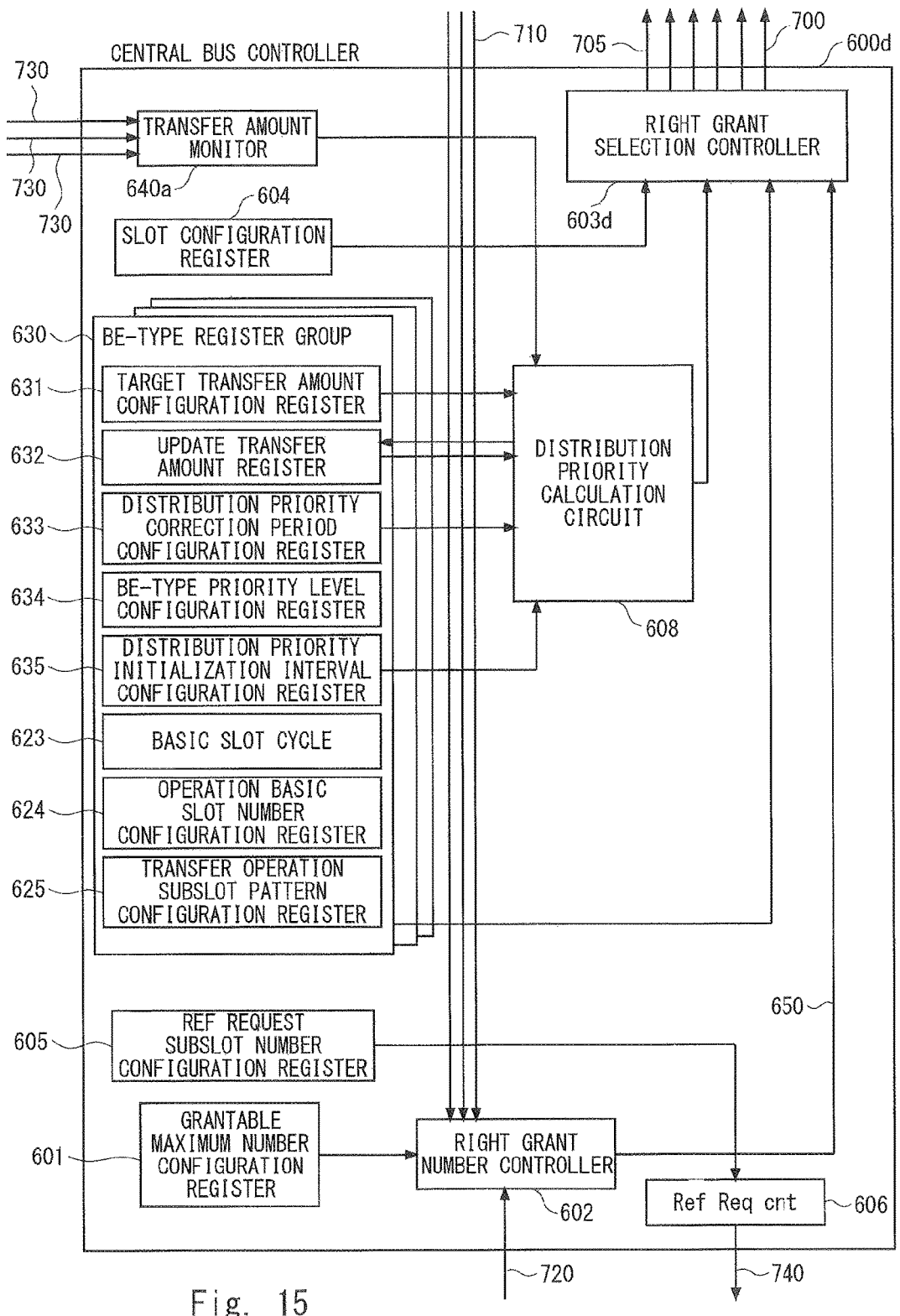
FIG. 15 is a configuration diagram of a central bus controller according to a third embodiment.

With reference next to FIG. 15, the central bus controller 600d will be described. As shown in FIG. 15, the central bus controller 600d includes a grantable maximum number configuration register 601, a right grant number controller 602, a right grant selection controller 603d, a slot configuration register 604, a refresh request subslot number configuration register 605, a refresh request controller 606, a distribution priority calculation circuit 608, a best effort (BE)-type register group 630, and a transfer amount monitor 640a. Since the configurations of the grantable maximum number configuration register 601, the right grant number controller 602, the slot configuration register 604, the refresh request subslot number configuration register 605, and the refresh request controller 606 are the same as those in the second embodiment, the descriptions thereof will be omitted. The best effort type register group may be called a second configuration register group.

Since the basic functions of the transfer amount monitor 640a in the third embodiment are the same as those of the transfer amount monitor 640a in the second embodiment, the descriptions thereof will be omitted. The transfer amount monitor 640a in the third embodiment outputs, however, the amount of requests transferred from the plurality of masters 100 that has been measured to the distribution priority calculation circuit 608.

The best effort type register group 630 includes a target transfer amount configuration register 631, an update transfer amount register 632, a distribution priority correction period configuration register 633, a best effort type priority level configuration register 634, a distribution priority initialization interval configuration register 635, a basic slot cycle configuration register 623, an operation basic slot number configuration register 624, and a transfer operation subslot pattern configuration register 625. Since the configurations of the basic slot cycle configuration register 623, the operation basic slot number configuration register 624, and the transfer operation subslot pattern configuration register 625 are the same as those in the second embodiment, the descriptions thereof will be omitted. Further, since a relation between the plurality of masters 100 and the best effort type register group 630 is the same as the relation between the plurality of masters 100 and the reservation-type register group 620a, the descriptions thereof will be omitted.

The target transfer amount configuration register 631 stores, for the plurality of masters 100, the target transfer amount for one subslot.

The update transfer amount register 632 stores, for the plurality of masters 100, the accumulated transfer amount indicating the accumulated value of the transfer amount.

The distribution priority correction period configuration register 633 stores a distribution priority correction period. The term "distribution priority" means the priority regarding a distribution of the access right. Further, the term "distribution priority correction period" means a period during which the target transfer amount of the plurality of masters 100 is corrected. Specifically, the target transfer amount after the period indicated by the distribution priority correction period from the current time is set as the target transfer amount to calculate the distribution priority. The value of the distribution priority correction period stored in the distribution priority correction period configuration register 633 can be changed. Further, the distribution priority correction period may be set for each subslot or may not be set for each subslot. Further, the distribution priority correction period may be common among the plurality of masters or may be different for each of the plurality of masters.

The best effort type priority level configuration register 634 stores, for the plurality of masters 100, the priority level. The priority level stored in the best effort type priority level configuration register 634 is added to the request in the request issuing controller 201a.

The distribution priority initialization interval configuration register 635 stores the number of subslots indicating the intervals at which the distribution priority is initialized. The initialization of the distribution priority means to initialize the accumulated transfer amount stored in the update transfer amount register 632. The value of the interval at which the distribution priority is initialized stored in the distribution priority initialization interval configuration register 635 can be changed. Further, the distribution priority initialization interval may be common among the plurality of masters or may be different for each of the plurality of masters.

The distribution priority calculation circuit 608 is a circuit that calculates the distribution priority indicating the priority regarding the distribution of the access right. The distribution priority calculation circuit 608 calculates the distribution priority based on, for example, the target transfer amount of the plurality of masters.

The distribution priority calculation circuit 608 will be described in detail. The distribution priority calculation circuit 608 receives the amount of requests transferred from the plurality of masters 100 from the transfer amount monitor 640a. Further, the distribution priority calculation circuit 608 reads out the target transfer amount for one subslot for the plurality of masters 100 from the target transfer amount configuration register 631. Further, the distribution priority calculation circuit 608 reads out the accumulated transfer amount for the plurality of masters 100 from the update transfer amount register 632. Further, the distribution priority calculation circuit 608 reads out the distribution priority correction period from the distribution priority correction period configuration register 633. Further, the distribution priority calculation circuit 608 reads out the distribution priority initialization interval from the distribution priority initialization interval configuration register 635. The distribution priority calculation circuit 608 then calculates the distribution priority using the amount of requests transferred from the plurality of masters 100, the target transfer amount for one subslot for the plurality of masters 100, the accumulated transfer amount for the plurality of masters 100, the distribution priority correction period, and the distribution priority initialization interval. The method of calculating the distribution priority will be described later in detail with reference to FIGS. 16A and 16B. Further, the distribution priority calculation circuit 608 outputs the distribution priority that has been calculated to the right grant selection controller 603d.

Further, the distribution priority calculation circuit 608 updates the accumulated transfer amount stored in the update transfer amount register 632 every time the subslot passes. Specifically, the distribution priority calculation circuit 608 calculates the accumulated transfer amount of up to the current subslot using the accumulated transfer amount of up to the previous subslot read out from the update transfer amount register 632 and the transfer amount of the current subslot received from the transfer amount monitor 640a. The distribution priority calculation circuit 608 then stores the accumulated transfer amount of up to the current subslot that has been calculated in the update transfer amount register 632.

The right grant selection controller 603d reads out the number of subslots that are present in one basic slot and the period of one subslot from the slot configuration register 604. Further, the right grant selection controller 603d receives the distribution priority from the distribution priority calculation circuit 608. Further, the right grant selection controller 603d reads out, for each of the plurality of masters 100, the basic slot cycle in which the access right is distributed from the basic slot cycle configuration register 623. Further, the right grant selection controller 603d reads out, for each of the plurality of masters 100, the basic slot number in which the access right is distributed from the operation basic slot number configuration register 624. Further, the right grant selection controller 603d reads out, for each of the plurality of masters 100, the subslot pattern in which the access right is distributed from the transfer operation subslot pattern configuration register 625. Further, the right grant selection controller 603d receives the number of grantable rights from the right grant number controller 602. Further, the right grant selection controller 603d reads out the priority levels of the plurality of masters 100 from the best effort type priority level configuration register 634.

The right grant selection controller 603d then selects the master which will be granted the access right using the number of subslots that are present in one basic slot, the period of one subslot, the distribution priority, the basic slot cycles of the plurality of masters 100, the basic slot numbers of the plurality of masters 100, the subslot patterns of the plurality of masters 100, and the number of grantable rights.

Further, the right grant selection controller 603d distributes the access right grant signal 700 to the master 100 that has been selected as a master that will be granted the access right. Specifically, the right grant selection controller 603d outputs the access right grant signal 700 to the sub bus controller 200a of the master 100 that has been selected. Further, the right grant selection controller 603d outputs, besides the access right grant signal 700, the priority level of the master 100 that has been selected to the sub bus controller 200a of the master 100 that has been selected. The selection of the master that will be granted the access right and the output of the access right grant signal 700 in the right grant selection controller 603d are performed at every cycle. Further, the right grant selection controller 603d outputs the priority level signal 705 indicating the priority level of the master 100 to the sub bus controller 200a of the master 100. The output of the priority level signal 705 in the right grant selection controller 603d is performed when the priority level is stored in the best effort type priority level configuration register 634. Accordingly, the priority level stored in the best effort type priority level configuration register 634 is reflected also in the sub bus controller 200a.

Figure 16A:
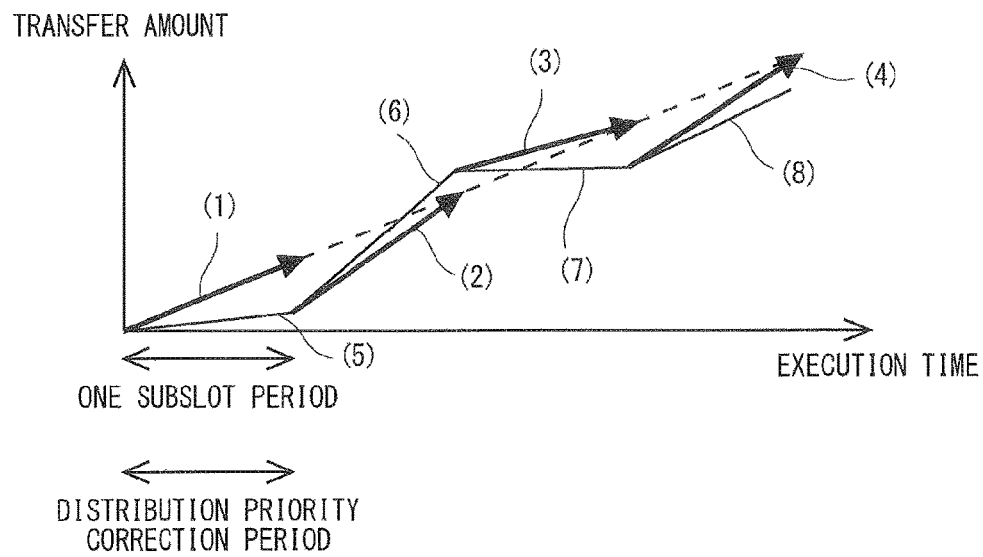
FIG. 16A is a diagram showing an example of a distribution priority of a master that issues requests at regular intervals according to the third embodiment.
Figure 16B:
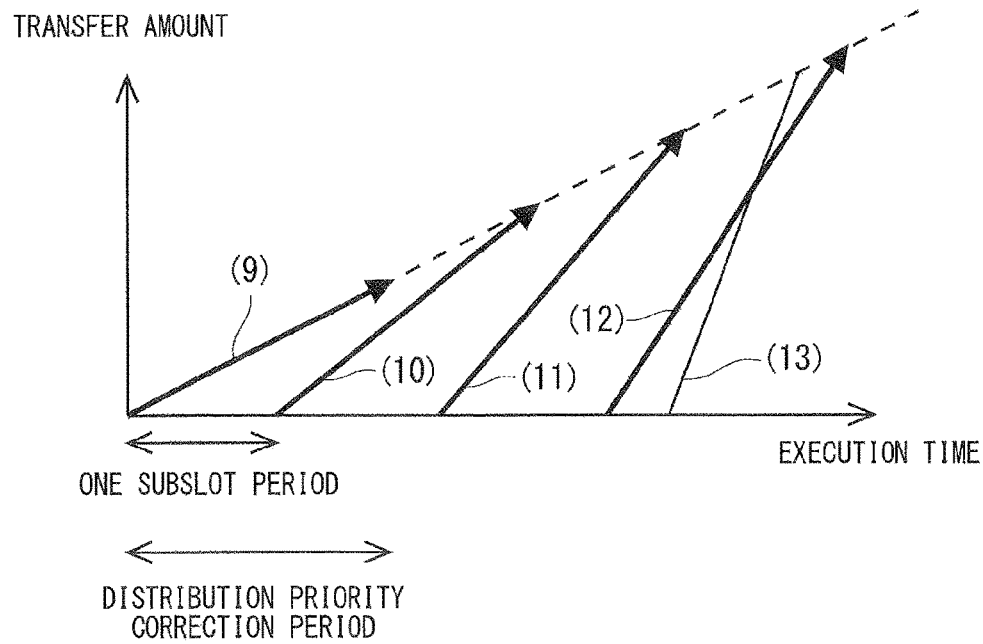
FIG. 16B is a diagram showing an example of a distribution priority of a master that does not issue requests in a first half and issues requests only in a second half according to the third embodiment.

With reference next to FIGS. 16A and 16B, the method of calculating the distribution priority by the distribution priority calculation circuit 608 will be described.

First, with reference to FIG. 16A, the method of calculating the distribution priority for the master that issues requests at regular intervals according to the third embodiment will be described. The master in FIG. 16A is assumed to be the master A. Further, the distribution priority correction period in FIG. 16A is assumed to be one subslot. Further, the dotted line shown in FIG. 16A is a line that is drawn based on the target transfer amount of the master A for one subslot. The length of the dotted line in the vertical axis direction indicates the target transfer amount in the execution time. Further, it is assumed that the inclinations of the arrows (1) to (4) shown in FIG. 16A each indicate the distribution priority and the distribution priority becomes higher as the inclination becomes larger. Further, the inclinations of the straight lines (5) to (8) shown in FIG. 16A each indicate the band width acquired by the master A.

The distribution priority calculation circuit 608 adds the transfer amount of the current subslot of the master A received from the transfer amount monitor 640a to the accumulated transfer amount of up to the previous subslot of the master A read out from the update transfer amount register 632 to thereby calculate the accumulated transfer amount of up to the current subslot.

Further, the distribution priority calculation circuit 608 calculates the target transfer amount after the distribution priority correction period using the target transfer amount of the master A for one subslot read out from the target transfer amount configuration register 631 and the distribution priority correction period read out from the distribution priority correction period configuration register 633. That is, the distribution priority calculation circuit 608 calculates the target transfer amount after one subslot, which is the distribution priority correction period.

The distribution priority calculation circuit 608 then calculates the distribution priority using the accumulated transfer amount of up to the current subslot and the target transfer amount after one subslot.

Next, as a specific example, the method of calculating the distribution priority indicated by the inclination of the arrow (1) shown in FIG. 16A will be described.

The inclination of the arrow (1) is calculated when the execution time is 0. The time when the execution time is 0 corresponds to the timing when the subslot just after the accumulated transfer amount of the master A stored in the update transfer amount register 632 is initialized is started. The initialization of the accumulated transfer amount of the master A stored in the update transfer amount register 632 is performed using the distribution priority initialization interval read out by the distribution priority calculation circuit 608 from the distribution priority initialization interval configuration register 635. That is, the initialization of the accumulated transfer amount of the master A is performed at intervals of the number of subslots indicated by the distribution priority initialization interval.

When the execution time is 0, the accumulated transfer amount of the master A of up to the current subslot is 0. Accordingly, the line obtained by connecting the point at which the execution time becomes 0 and the transfer amount becomes 0 and the point indicated by the target transfer amount after one subslot (when the execution time is one subslot), which is the distribution priority correction period, is the arrow (1).

Next, as a specific example, the method of calculating the distribution priority indicated by the inclination of the arrow (2) shown in FIG. 16A will be described.

The inclination of the arrow (2) is calculated when the execution time becomes one subslot. The inclination of the straight line (5) indicates the band width acquired by the master A when the execution time is zero to one subslot.

When the execution time is one subslot, the accumulated transfer amount of the master A of up to the previous subslot is 0. Further, the transfer amount of the current subslot of the master A received from the transfer amount monitor 640a corresponds to the length of the line (5) in the vertical axis direction when the execution time is one subslot. Therefore, the length of the line (5) in the vertical axis direction when the execution time is one subslot indicates the accumulated transfer amount of the master A of up to the current subslot. The line that connects the point indicating the accumulated transfer amount of the master A of up to the current subslot and the point indicating the target transfer amount after one subslot (when the execution time is two subslots) becomes the arrow (2).

Next, as a specific example, the method of calculating the distribution priority indicated by the inclination of the arrow (3) shown in FIG. 16A will be described.

The inclination of the arrow (3) is calculated when the execution time is two subslots. The inclination of the straight line (6) indicates the band width acquired by the master A when the execution time is one to two subslots.

The accumulated transfer amount of the master A of up to the current subslot when the execution time is two subslots corresponds to the length of the line (6) in the vertical axis direction when the execution time is two subslots. The line obtained by connecting the point indicating the accumulated transfer amount of the master A of up to the current subslot and the point indicated by the target transfer amount after one subslot (when the execution time is three subslots) is the arrow (3). Since the method of calculating the distribution priority indicated by the inclination of the arrow (4) shown in FIG. 16A is similar to the method stated above, the description thereof will be omitted.

Next, with reference to FIG. 16B, the method of calculating the distribution priority for the master that does not issue requests in a first half and issues requests only in a second half according to the third embodiment will be described. The master in FIG. 16B is assumed to be the master B. Further, the distribution priority correction period in FIG. 16B is assumed to be 1.7 subslots. Further, the dotted line shown in FIG. 16B is a line that is drawn based on the target transfer amount of the master B for one subslot. The length of the dotted line in the vertical axis direction indicates the target transfer amount in the execution time. Further, the inclinations of the arrows (9) to (12) shown in FIG. 16B each indicate the distribution priority. Further, the inclination of the straight line (13) shown in FIG. 16B indicates the band width acquired by the master B.

Next, as a specific example, the method of calculating the distribution priority indicated by the inclination of the arrow (9) shown in FIG. 16B will be described.

The inclination of the arrow (9) is calculated when the execution time is 0. When the execution time is 0, the accumulated transfer amount of the master B of up to the current subslot is 0. Accordingly, the line that connects the point at which the execution time is 0 and the transfer amount is 0 and the point indicated by the target transfer amount after 1.7 subslots (when the execution time is 1.7 subslots), which is the distribution priority correction period, is the arrow (9).

Next, as a specific example, the method of calculating the distribution priority indicated by the inclination of the arrow (10) shown in FIG. 16B will be described.

The inclination of the arrow (10) is calculated when the execution time is one subslot. Since the master B has not sent a request, it does not acquire the band width when the execution time is one subslot. Therefore, when the execution time is one subslot, the accumulated transfer amount of the master B of up to the current subslot is 0. Therefore, the line obtained by connecting the point at which the execution time is 0 and the transfer amount is 0 and the point indicated by the target transfer amount after 1.7 subslots (when the execution time is 2.7 subslots), which is the distribution priority correction period, is the arrow (10). Since the method of calculating the distribution priority indicated by the inclinations of the arrows (11) and (12) shown in FIG. 16B is similar to the method stated above, the description thereof will be omitted.

Next, the band width acquired by the master B indicated by the inclination of the straight line (13) will be described. When the execution time is three subslots, the distribution priority indicated by the inclination of the arrow (12) is calculated as the distribution priority of the master B. Further, it is assumed that the master B has been selected as the master that will be granted the access right using the distribution priority of the master B. After the master B sends the request, the master B acquires the band width indicated by the inclination of the straight line (13).

As described above, in the semiconductor device according to the third embodiment, the distribution priority is calculated by the distribution priority calculation circuit 608 based on the target transfer amount of the master. It is therefore possible to correct the acquired transfer amount in a long period of time.

Further, the distribution priority correction period configuration register 633 stores the distribution priority correction period. Further, the value of the distribution priority correction period stored in the distribution priority correction period configuration register 633 can be changed. It is therefore possible to calculate the optimal distribution priority in accordance with the system.

Further, the distribution priority initialization interval configuration register 635 stores the number of subslots indicating the intervals at which the distribution priority is initialized. Further, by initializing the distribution priority, the accumulated transfer amount stored in the update transfer amount register 632 is initialized. It is therefore possible to mitigate the accumulation of the error in a long period of time. Further, it is possible to set the reset interval in accordance with the operation of the master.

Further, a configuration in which the plurality of best effort type register groups 630 and the plurality of masters 100 are associated with each other may be employed. It is therefore possible to perform a similar control even when the number of best effort type register groups 630 is not made equal to the number of masters 100.

Fourth Embodiment

Figure 17:
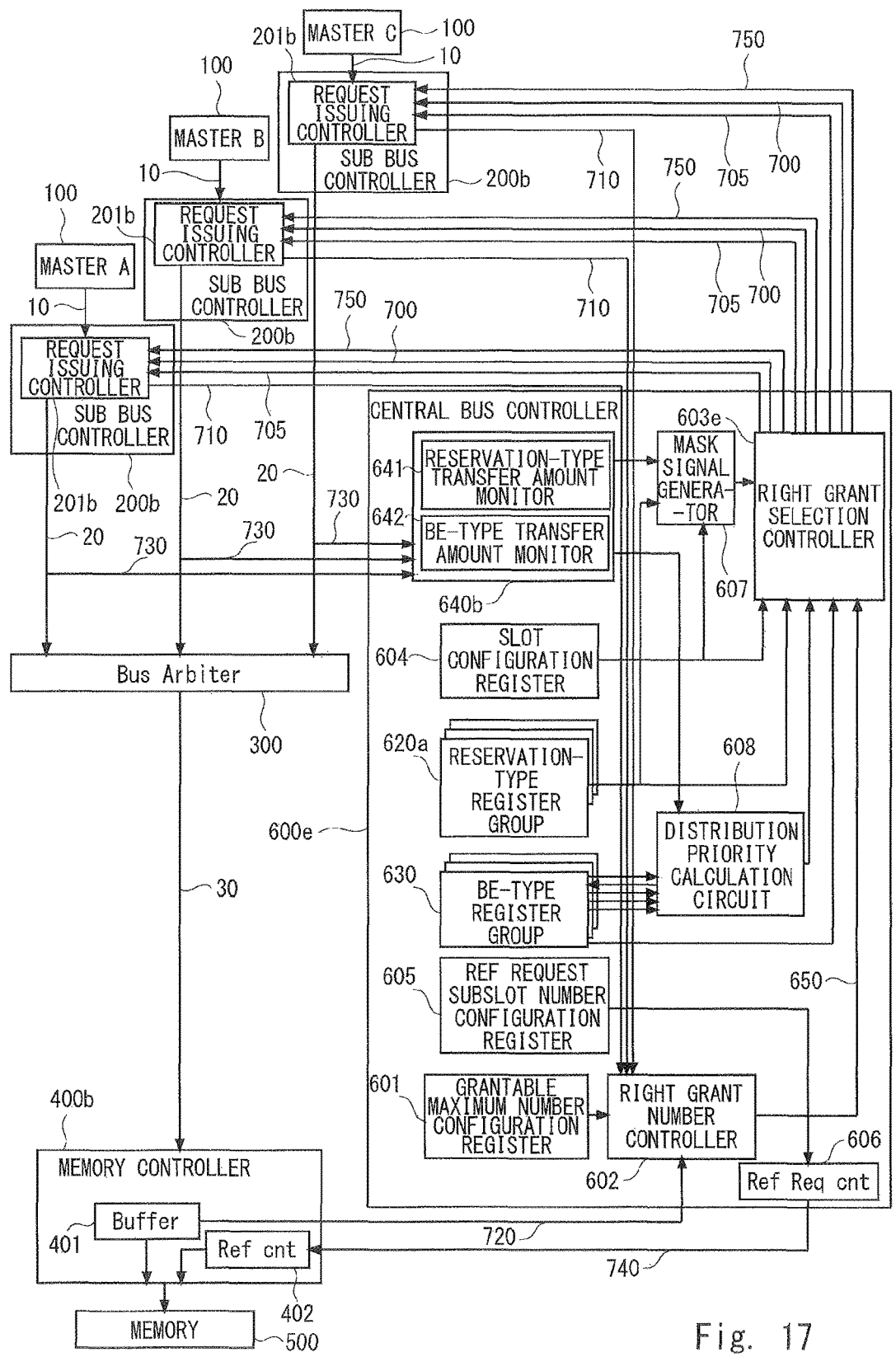
FIG. 17 is a configuration diagram of a semiconductor device according to a fourth embodiment.

Next, a fourth embodiment will be described. In the fourth embodiment, the control of the access right using the reservation-type register group 620a in the second embodiment and the control of the access right using the best effort type register group 630 in the third embodiment are performed in a complexed manner. As shown in FIG. 17, the semiconductor device according to the fourth embodiment includes sub bus controllers 200b and a central bus controller 600e. Since the configurations other than the configurations of the sub bus controllers 200b and the central bus controller 600e are the same as those in the second and third embodiments, the descriptions thereof will be omitted.

The central bus controller 600e includes a grantable maximum number configuration register 601, a right grant number controller 602, a right grant selection controller 603e, a slot configuration register 604, a refresh request subslot number configuration register 605, a refresh request controller 606, a mask signal generator 607, a distribution priority calculation circuit 608, a reservation-type register group 620a, a best effort type register group 630, and a transfer amount monitor 640b. Since the configurations other than the configurations of the right grant selection controller 603e and the transfer amount monitor 640b are the same as those of the second or third embodiment, the descriptions thereof will be omitted.

First, the right grant selection controller 603e will be described. The right grant selection controller 603e is a function unit including both the function for selecting the master that will be granted the access right in the right grant selection controller 603b in the second embodiment and the function for selecting the master that will be granted the access right in the right grant selection controller 603d in the third embodiment. The processing for selecting the master that will be granted the access right in the right grant selection controller 603b is called selection processing that uses the reservation-type register group 620a. Further, the processing for selecting the master which will be granted the right in the right grant selection controller 603d is called selection processing that uses the best effort type register group 630. The right grant selection controller 603e independently performs the selection processing using the reservation-type register group 620a and the selection processing using the best effort type register group 630.

When the two selection processings contend with each other, the priority is given to one of the selection processings. The situation in which the two selection processings contend with each other means a situation in which one master is selected as the master which will be granted the right in both of the selection processings. If the priority is given to the selection processing using the best effort type register group 630, for example, when the two selection processings contend with each other, this master is selected as the master which will be granted the access right by the selection processing using the best effort type register group 630.

The right grant selection controller 603e distributes the access right grant signal 700 to the master 100 that has been selected. Specifically, the right grant selection controller 603e outputs the access right grant signal 700 to the sub bus controller 200b of the master 100 that has been selected. Further, the right grant selection controller 603e outputs, besides the access right grant signal 700, the priority level of the master 100 that has been selected and an access right attribute signal 750 to the sub bus controller 200b of the master 100.

Next, the access right attribute signal 750 will be described. The access right attribute signal 750 is identification information indicating whether the access right that has been granted is the access right granted by the selection processing using the reservation-type register group 620a or the access right granted by the selection processing using the best effort type register group 630. The access right granted by the selection processing using the reservation-type register group 620a is called an access right granted using the reservation-type register group 620a. Further, the access right granted by the selection processing using the best effort type register group 630 is called an access right granted using the best effort type register group 630.

Next, the sub bus controller 200b will be described. The sub bus controller 200b includes a request issuing controller 201b. Since the control in the request issuing controller 201b is the same as the control in the request issuing controller 201a except for the control regarding the access right attribute signal 750, the overlapping descriptions will be omitted.

The request issuing controller 201b receives the access right attribute signal 750 from the right grant selection controller 603e. Further, when the request issuing controller 201b outputs a request received from the bus 10 to the bus 20, the request issuing controller 201b adds the access right attribute signal 750 to the request and outputs the resulting signal.

Next, the transfer amount monitor 640b will be described. The transfer amount monitor 640b includes a reservation-type transfer amount monitor 641 and a best effort transfer amount monitor 642.

The reservation-type transfer amount monitor 641 is a function unit that measures the amount of reservation-type requests transferred to the bus arbiter 300 from the plurality of masters 100 via the respective sub bus controllers 200b. The reservation-type request indicates the request that has passed the request issuing controller 201b by the access right that has been granted using the reservation-type register group 620a.

The reservation-type transfer amount monitor 641 measures the amount of the reservation-type requests transferred from the plurality of masters 100 by the monitor signal 730 from the plurality of buses 20. Whether the request is the reservation-type request is identified by the access right attribute signal 750 added to the monitor signal 730. The reservation-type transfer amount monitor 641 then outputs the amount of the reservation-type requests transferred from the plurality of masters 100 that has been measured to the mask signal generator 607.

The best effort transfer amount monitor 642 is a function unit that measures the amount of the best effort type requests transferred to the bus arbiter 300 from the plurality of masters 100 via the respective sub bus controllers 200b. The term "best effort type request" means a request that has passed the request issuing controller 201b by the access right that has been granted using the best effort type register group 630.

The best effort transfer amount monitor 642 measures the amount of the best effort type requests transferred from the plurality of masters 100 by the monitor signal 730 from the plurality of busses 20. Whether the request is the best effort type request is identified by the access right attribute signal 750 added to the monitor signal 730. The best effort transfer amount monitor 642 then outputs the amount of the best effort type requests transferred from the plurality of masters 100 that has been measured to the distribution priority calculation circuit 608.

As described above, in the semiconductor device according to the fourth embodiment, the right grant selection controller 603e distributes two kinds of access rights: the access right that has been granted using the reservation-type register group 620a and the access right that has been granted using the best effort type register group 630. It is therefore possible to efficiently control the master which needs to acquire a predetermined band width in a short period of time and the master which needs to acquire a predetermined band width in a long period of time.

In the aforementioned example, while the example in which the control of the access right using the reservation-type register group 620a in the second embodiment and the control of the access right using the best effort type register group 630 in the third embodiment are performed in a complexed manner has been described in the fourth embodiment, the present invention is not limited to this example. The control of the access right using the reservation-type register group 620b in the modified example of the second embodiment and the control of the access right using the best effort type register group 630 in the third embodiment may be performed in a complexed manner.

While the present invention made by the present inventors has been described with reference to the embodiments, the present invention is not limited to the above embodiments. Various changes may be made on the embodiments within the scope of the present invention.

REFERENCE SIGNS LIST

100 MASTER
200a, 200b SUB BUS CONTROLLER
201a, 201b REQUEST ISSUING CONTROLLER
300 BUS ARBITER
400a, 400b MEMORY CONTROLLER
401 BUFFER
402 REFRESH CONTROLLER
500 MEMORY
600a, 600b, 600c, 600d, 600e CENTRAL BUS CONTROLLER
601 GRANTABLE MAXIMUM NUMBER CONFIGURATION REGISTER
602 RIGHT GRANT NUMBER CONTROLLER
603a, 603b, 603c, 603d, 603e RIGHT GRANT SELECTION CONTROLLER
604 SLOT CONFIGURATION REGISTER
605 REFRESH REQUEST SUBSLOT NUMBER CONFIGURATION REGISTER
606 REFRESH REQUEST CONTROLLER
607 MASK SIGNAL GENERATOR
608 DISTRIBUTION PRIORITY CALCULATION CIRCUIT
610 QoS INFORMATION REGISTER
620a, 620b RESERVATION-TYPE REGISTER GROUP
621 RESERVED BAND WIDTH CONFIGURATION REGISTER
622 RESERVATION-TYPE PRIORITY LEVEL CONFIGURATION REGISTER
623 BASIC SLOT CYCLE CONFIGURATION REGISTER
624 OPERATION BASIC SLOT NUMBER CONFIGURATION REGISTER
625 TRANSFER OPERATION SUBSLOT PATTERN CONFIGURATION REGISTER
626 RESERVED BAND WIDTH TABLE CONFIGURATION REGISTER
630 BEST EFFORT TYPE REGISTER GROUP
631 TARGET TRANSFER AMOUNT CONFIGURATION REGISTER
632 UPDATE TRANSFER AMOUNT REGISTER
633 DISTRIBUTION PRIORITY CORRECTION PERIOD CONFIGURATION REGISTER
634 BEST EFFORT TYPE PRIORITY LEVEL CONFIGURATION REGISTER
635 DISTRIBUTION PRIORITY INITIALIZATION INTERVAL CONFIGURATION REGISTER
640a, 640b TRANSFER AMOUNT MONITOR
641 RESERVATION-TYPE TRANSFER AMOUNT MONITOR
642 BEST EFFORT TRANSFER AMOUNT MONITOR

The invention claimed is:

1. A semiconductor device comprising:
a plurality of masters;
a memory controller;
a bus that connects the plurality of masters and the memory controller;
a Quality of Service (QoS) information register that stores QoS information of the plurality of masters;
a right grant number controller that calculates the number of grantable access rights based on space information of a buffer of the memory controller;
a right grant selection controller that selects a master that will be granted the access right based on the QoS information of the QoS information register and the number of grantable rights from the right grant number controller; and
a request issuing controller that does not pass a request from the master that has not been granted the access right from the right grant selection controller.

2. The semiconductor device according to claim 1, further comprising:
a grantable maximum number configuration register that stores the maximum number of the grantable rights,
wherein the right grant number controller calculates the number of grantable rights based on space information of the buffer of the memory controller, an upper limit of the number of grantable rights being the maximum number stored in the grantable maximum number configuration register.

3. The semiconductor device according to claim 1, wherein:

the request issuing controller returns the access right when it does not hold a request from the master that has been granted the access right, and the right grant number controller calculates the number of grantable access rights based on space information of the buffer of the memory controller and the number of access rights that have been returned.

4. A semiconductor device comprising:
a plurality of masters;
a memory controller;
a bus that connects the plurality of masters and the memory controller;
a first configuration register group comprising a reserved band width configuration register that stores reserved band widths of the plurality of masters;
a slot configuration register that stores a predetermined period;
a transfer amount monitor that measures a transfer amount of the plurality of masters;
a right grant number controller that calculates the number of grantable access rights based on space information of the buffer of the memory controller;
a right grant selection controller that selects a master that will be granted the access right based on configuration information of the first configuration register group, the predetermined period of the slot configuration register, the transfer amount measured by the transfer amount monitor, and the number of grantable rights from the right grant number controller; and
a request issuing controller that does not pass the request from the master which is not granted the access right from the right grant selection controller.

5. The semiconductor device according to claim 4, wherein the first configuration register group further comprises a reservation-type priority level configuration register that stores priority levels of the plurality of masters.

6. The semiconductor device according to claim 4, wherein the first configuration register group further comprises an operation basic slot number configuration register that stores, for each of the plurality of masters, a number of a basic slot in which the access right is distributed.

7. The semiconductor device according to claim 6, wherein the first configuration register group further comprises a transfer operation subslot pattern configuration register that stores, for each of the plurality of masters, a subslot pattern in which the access right is distributed.

8. The semiconductor device according to claim 6, wherein the first configuration register group further comprises a basic slot cycle configuration register that stores, for each of the plurality of masters, a cycle of the basic slot in which the access right is distributed.

9. The semiconductor device according to claim 6, wherein the first configuration register group comprises, in place of the reserved band width configuration register, a reserved band width table configuration register that stores, for each of the plurality of masters, the reserved band width for each subslot.

10. The semiconductor device according to claim 4, further comprising a refresh request controller configured to output a refresh request signal of a memory to the memory controller.

11. The semiconductor device according to claim 10, further comprising a refresh request subslot number configuration register that stores a subslot number in which the refresh request controller issues a refresh request.

12. The semiconductor device according to claim 4, comprising a plurality of first configuration register groups, wherein the plurality of first configuration register groups and the plurality of masters are associated with each other.

13. The semiconductor device according to claim 4, wherein:
the request issuing controller returns the access right when it does not hold a request from the master that has been granted the access right; and
the right grant number controller calculates the number of grantable access rights based on space information of the buffer of the memory controller and the number of access rights that have been returned.

14. A semiconductor device comprising:
a plurality of masters;
a memory controller;
a bus that connects the plurality of masters and the memory controller;
a second configuration register group comprising a target transfer amount configuration register that stores a target transfer amount of the plurality of masters;
a slot configuration register that stores a predetermined period;
a distribution priority calculation circuit that calculates a distribution priority, which is a priority of a distribution of the access right, based on the target transfer amount,
a right grant number controller that calculates the number of grantable access rights based on space information of a buffer of the memory controller;
a right grant selection controller that selects a master that will be granted the access right based on the predetermined period of the slot configuration register, the distribution priority calculated by the distribution priority calculation circuit, and the number of grantable rights from the right grant number controller; and
a request issuing controller that does not pass a request from a master that has not been granted the access right from the right grant selection controller.

15. The semiconductor device according to claim 14, further comprising:
a transfer amount monitor that measures a transfer amount of the plurality of masters, wherein:
the second configuration register group further comprises a distribution priority correction period configuration register that stores a period during which the target transfer amount is corrected, and
the distribution priority calculation circuit calculates a distribution priority which indicates a priority of a distribution of the access right based on the target transfer amount, an accumulated value of the transfer amount measured by the transfer amount monitor, and the period during which the target transfer amount is corrected.

16. The semiconductor device according to claim 14, wherein the second configuration register group further comprises a best effort type priority level configuration register that stores priority levels of the plurality of masters.

17. The semiconductor device according to claim 14, wherein the second configuration register group further comprises a distribution priority initialization interval configuration register that stores intervals at which the distribution priority is initialized.

18. The semiconductor device according to claim 14, wherein the second configuration register group further comprises a basic slot cycle configuration register that stores, for each of the plurality of masters, a cycle of the basic slot in which the access right is distributed.

19. The semiconductor device according to claim 18, wherein the second configuration register group further comprises an operation basic slot number configuration register that stores, for each of the plurality of masters, the basic slot in which the access right is distributed.

20. The semiconductor device according to claim 14, further comprising a refresh request controller configured to output a refresh request signal of a memory to the memory controller.

21. The semiconductor device according to claim 20, further comprising a refresh request subslot number configuration register that stores a subslot number in which the refresh request controller issues a refresh request.

22. The semiconductor device according to claim 14, comprising a plurality of second configuration register groups, wherein the plurality of second configuration register groups and the plurality of masters are associated with each other.

23. The semiconductor device according to claim 14, wherein:
the request issuing controller returns the access right when it does not hold a request from the master that has been granted the access right; and
the right grant number controller calculates the number of grantable access rights based on space information of the buffer of the memory controller and the number of access rights that have been returned.

24. The semiconductor device according to claim 14, further comprising:
a first configuration register group comprising a reserved band width configuration register that stores reserved band widths of the plurality of masters; and
a transfer amount monitor that measures a transfer amount of the plurality of masters, wherein:
the right grant selection controller selects the master which will be granted the right based on configuration information of the first configuration register group, the predetermined period of the slot configuration register, the transfer amount measured by the transfer amount monitor, and the number of grantable rights from the right grant number controller, or the predetermined period of the slot configuration register, the distribution priority calculated in the distribution priority calculation circuit, and the number of grantable rights from the right grant number controller,
the right grant selection controller distributes, together with the access right grant signal, an access right attribute signal that identifies whether the access right that has been granted is the one that has been granted using the first configuration register group or the one that has been granted using the second configuration register group, and
the transfer amount monitor comprises a function of measuring the transfer amount of the master in accordance with the access right attribute signal.

* * * * *